United States Patent
Xu et al.

(10) Patent No.: US 9,087,933 B2
(45) Date of Patent: Jul. 21, 2015

(54) LIGHT-EMITTING DIODE AND METHOD FOR PREPARING THE SAME

(71) Applicant: HC Semitek Corporation, Wuhan (CN)

(72) Inventors: Jin Xu, Wuhan (CN); Jiangbo Wang, Wuhan (CN); Rong Liu, Wuhan (CN)

(73) Assignee: HC SEMITEK CORPORATION, Wuhan (CN)

( * ) Notice: Subject to any disclaimer, the term of this patent is extended or adjusted under 35 U.S.C. 154(b) by 0 days.

(21) Appl. No.: 14/166,876

(22) Filed: Jan. 29, 2014

(65) Prior Publication Data

US 2014/0145204 A1    May 29, 2014

Related U.S. Application Data

(63) Continuation-in-part of application No. PCT/CN2012/079246, filed on Jul. 27, 2012.

(30) Foreign Application Priority Data

Aug. 1, 2011   (CN) .............................. 201110217923

(51) Int. Cl.
  *H01L 21/00*   (2006.01)
  *H01L 33/00*   (2010.01)
  *H01L 33/20*   (2010.01)
  *H01L 33/60*   (2010.01)
  *H01L 33/46*   (2010.01)
  *H01L 21/02*   (2006.01)

(52) U.S. Cl.
  CPC .......... *H01L 33/0075* (2013.01); *H01L 33/007* (2013.01); *H01L 33/0079* (2013.01); *H01L 33/20* (2013.01); *H01L 33/60* (2013.01); *H01L 21/0242* (2013.01); *H01L 21/0254* (2013.01); *H01L 21/02639* (2013.01); *H01L 21/02647* (2013.01); *H01L 33/46* (2013.01); *H01L 2924/12041* (2013.01); *H01L 2933/0091* (2013.01)

(58) Field of Classification Search
  None
  See application file for complete search history.

(56) References Cited

U.S. PATENT DOCUMENTS

| 8,394,652 | B2* | 3/2013 | Minato et al. ................... 438/22 |
| 8,435,812 | B1* | 5/2013 | Zhu et al. ........................ 438/29 |
| 8,704,257 | B2* | 4/2014 | Chen et al. ..................... 257/98 |
| 2008/0210969 | A1* | 9/2008 | Yuan et al. ...................... 257/98 |
| 2010/0246624 | A1* | 9/2010 | Hiroyama et al. ......... 372/45.01 |
| 2011/0220935 | A1* | 9/2011 | Gotoda et al. .................. 257/98 |
| 2012/0228656 | A1* | 9/2012 | Kamiyama et al. ............. 257/98 |

* cited by examiner

*Primary Examiner* — Angel Roman
(74) *Attorney, Agent, or Firm* — Matthias Scholl P.C.; Matthias Scholl

(57) ABSTRACT

A method for preparing a light-emitting diode having a vertical structure by stripping a GaN base epitaxial layer and a sapphire substrate by a wet process, the method including: a) preparing a graphical growth substrate; b) growing a GaN base light-emitting diode epitaxial layer on the graphical growth substrate, the GaN base light-emitting diode epitaxial layer from the bottom to the top successively including a N-type GaN layer and a P-type GaN layer; c) successively forming a transparent and electrically conductive film, an omni-directional reflection layer, an electrically conductive reflection layer, and a passive metal protection layer from the bottom to the top on the GaN base light-emitting diode epitaxial layer; and d) removing the first layer of stable material with a high melting point of the growth substrate by dry etching, exposing the N-type GaN layer, and preparing an N electrode on the N-type GaN layer.

20 Claims, 44 Drawing Sheets

LIGHT-EMITTING DIODE AND METHOD FOR PREPARING THE SAME

CROSS-REFERENCE TO RELATED APPLICATIONS

This application is a continuation-in-part of International Patent Application No. PCT/CN2012/079246 with an international filing date of Jul. 27, 2012, designating the United States, now pending, and further claims priority benefits to Chinese Patent Application No. 201110217923.9 filed Aug. 1, 2011. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The present invention relates to a method for preparing a light-emitting diode having a vertical structure, and more particularly to a method for preparing a light-emitting diode having a vertical structure by stripping GaN base epitaxial layer and sapphire substrate by a wet process.

2. Description of the Related Art

A light-emitting diode is a light-emitting device which converts the electrical energy to the light energy and is currently the most promising next-generation light source. The light-emitting diode usually gives out light through intrinsic transitions of direct band gap semiconductor and has a high photoelectric conversion efficiency, namely internal quantum effect.

The luminous efficiency of the GaN base light-emitting diode is significantly improved in recently years, but it cannot completely replace the conventional light resource. At present, the quantum efficiency, the current distribution uniformity and device cooling capacity has become main technical bottlenecks which limit further improvements of the performance of light-emitting diodes.

Semiconductor light-emitting diodes can be divided into two categories according to geometry structures: semiconductor light-emitting diodes with lateral structure and semiconductor light-emitting diodes with vertical structure.

The main disadvantages of the semiconductor light-emitting diodes with lateral structure include low heat dissipation efficiency, current congestion, low current density and high production cost. In order to resolve the heat dissipation problem of the semiconductor light-emitting diodes with lateral structure, flip chip technology is provided. However, the flip chip technology is very complicated and the production cost is high.

In addition, the sapphire which is usually used as a support substrate of a light-emitting diode has drawbacks that the electrical conductivity is very low and its lattice constant does not match with the GaN material. The thermal resistant of the device is increased due to the very low electrical conductivity, which causes serious self-heating effect. Moreover, the mismatch of the lattice constant between the sapphire and the GaN material leads to a high defection density in the GaN epitaxial layer and also results in a strong biaxial stress existing in the GaN. Especially, when the temperature of the chip is changing, the difference of thermal expansion coefficients will bring additional thermal stress into the GaN.

At present, a lot of researches are carried out for the semiconductor light-emitting diodes with vertical structure. Two electrodes of the semiconductor light-emitting diode with vertical structure are located on two sides of the epitaxial layer, which has the same advantage of high heat dissipation efficiency as flip chip technology and does not have disadvantages of flip chip technology, and also has advantages such as uniform current distribution, increased current density, and high light extraction efficiency and so on.

However, during the preparing process of the semiconductor light-emitting diode, the growth substrate is usually stripped by laser or mechanical grinding. The production cost for stripping the growth substrate by laser is high, and the laser beam causes damage to the epitaxial layer, therefore resulting in a low yield. For the method which strips the growth substrate by mechanical grinding, since the precision of the mechanical grinding is low and the grinding has non-uniformity, the grinding precision cannot be controlled and the products yield is low.

Therefore, there is a need to provide a method for preparing a light-emitting diode having a vertical structure without stripping the growth substrate by non laser or mechanical grinding method.

SUMMARY OF THE INVENTION

One aspect of the present invention is to provide a method for preparing a light-emitting diode having a vertical structure by stripping a GaN base epitaxial layer and a sapphire substrate by a wet process, the method comprising:
   a) preparing a graphical growth substrate, the growth substrate from bottom to top successively including a sapphire substrate, a second layer of easily corroded material with a high melting point, and a first layer of stable material with a high melting point, wherein the melting points of the first layer and the second layer of material with a high melting point are greater than 900° C.;
   b) growing a GaN base light-emitting diode epitaxial layer on the graphical growth substrate, the GaN base light-emitting diode epitaxial layer from bottom to top successively including a N-type GaN layer and a P-type GaN layer;
   c) successively forming a transparent and electrically conductive film, an omni-directional reflection layer, an electrically conductive reflection layer and a passive metal protection layer from bottom to top on the GaN base light-emitting diode epitaxial layer, the electrically conductive reflection layer being connected with the transparent and electrically conductive film through holes in the omni-directional reflection layer, binding a support substrate having a high thermal conductivity to the passive metal protection layer by binding technology, removing partial GaN base epitaxial layer in the growth substrate and stripping the sapphire substrate by a wet process; and
   d) removing the first layer of stable material with a high melting point in the growth substrate by dry etching, exposing the N-type GaN layer, and preparing an N electrode on the N-type GaN layer.

Another aspect of the present invention is to provide a light-emitting diode having a vertical structure prepared by the above method. The light-emitting diode having a vertical structure successively comprises:
   a support substrate (100) with a high thermal conductivity, a binding layer, a passive metal protection layer (60), a conductive reflection layer (59), an omni-directional reflection layer (40), a transparent and electrically conductive film (30), a GaN base epitaxial layer and an N electrode (110).

The conductive reflection layer (59) is connected with the transparent and electrically conductive film through holes in the omni-directional reflection layer (40), and the GaN base epitaxial layer successively includes a P-type GaN layer (21) and a N-type GaN layer (20).

The method of the invention stripping the sapphire substrate by a wet process rather than the laser or the mechanical grinding method causes low damage to the epitaxial layer and can strip the sapphire substrate completely. The performance of the light-emitting diode having a vertical structure manufactured by the method is good, and the light-emitting diode has advantages of high luminous efficacy, uniform current distribution, improved current congestion, increased current density, high light extraction efficiency and excellent heat dissipation.

Reference Signs List: 10—Sapphire substrate; 11—$SiO_2$ film; 12—$SiN_x$ film; 13—Passive film; 14—Mask; 15—Mask; 20—N-type GaN; 21—P-type GaN; 22—High density defect region; 30—Transparent and electrically conductive film; 40—Omni-directional reflection layer; 50—Conductive reflection layer; 60—Passive metal protection layer; 70, 71, 80—Binding layer; 81, 90—Metal layer for binding; 100—Support substrate; 120—Insulation material.

DETAILED DESCRIPTION OF THE EMBODIMENTS

The present invention will be further illustrated accompany with the figures and preferable embodiments. The characteristics and advantages of the present invention will be more clarity and clear along with the following description.

According to an aspect of the present invention, there is provided a method for preparing a light-emitting diode having a vertical structure by stripping a GaN base epitaxial layer and a sapphire substrate by a wet process, the method comprising:

a) preparing a graphical growth substrate, the growth substrate from bottom to top successively including a sapphire substrate, a second layer of easily corroded material with a high melting point, and a first layer of stable material with a high melting point, wherein the melting points of the first layer and the second layer of material with a high melting point are greater than 900° C.;

b) growing a GaN base light-emitting diode epitaxial layer on the graphical growth substrate, the GaN base light-emitting diode epitaxial layer from bottom to top successively including a N-type GaN layer and a P-type GaN layer;

c) successively forming a transparent and electrically conductive film, an omni-directional reflection layer, an electrically conductive reflection layer and a passive metal protection layer from bottom to top on the GaN base light-emitting diode epitaxial layer, the electrically conductive reflection layer being connected with the transparent and electrically conductive film through holes in the omni-directional reflection layer, binding a support substrate having a high thermal conductivity to the passive metal protection layer by binding technology, removing partial GaN base epitaxial layer in the growth substrate and stripping the sapphire substrate by a wet process; and d) removing the first layer of stable material with a high melting point in the growth substrate by dry etching, exposing the N-type GaN layer, and preparing an N electrode on the N-type GaN layer.

The material with a high melting point described herein means a material with a melting point higher than 900° C.

The easily corroded material described herein means a material which is easily corroded by an acid or alkaline solution, such as Sift.

The stable material described herein means a material that does not react with an acid or alkaline solution and thus does not be corroded by the acid or alkaline solution, such as $SiN_x$, $x \approx 3/4$.

Figure 1:
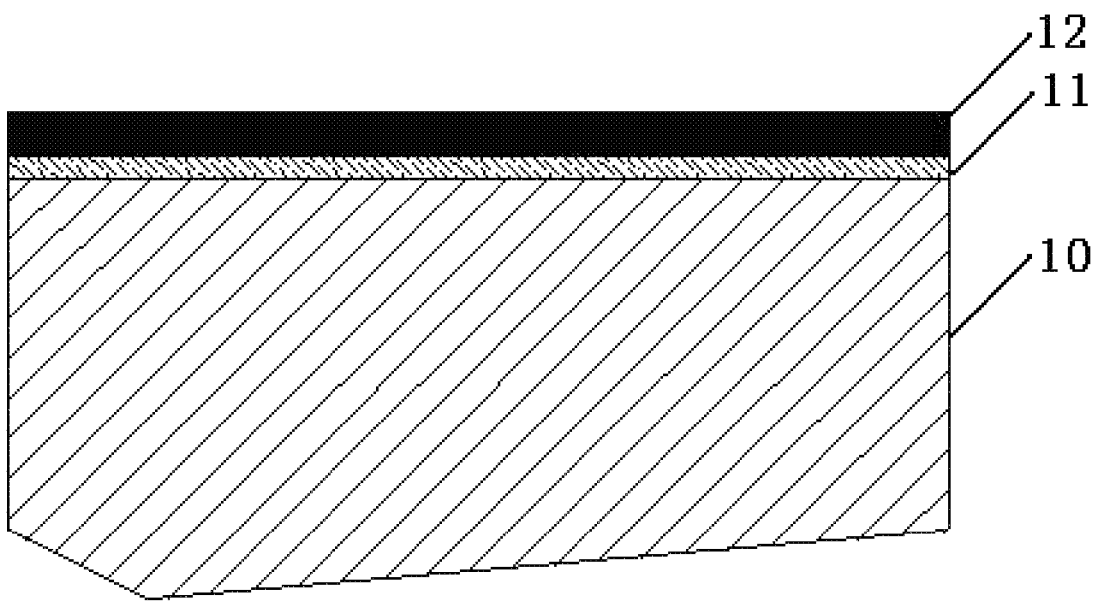
FIGS. 1-23 are schematic views illustrating a method for preparing a light-emitting diode having a vertical structure according to a first embodiment of the present invention.

According to a preferable embodiment of the invention, step a) comprises:

a1) successively forming two layers of high melting point material film on the sapphire substrate 10, the second layer of material adjacent to the sapphire substrate is easily corroded material with a high melting point 11, and the first layer of material is stable material with a high melting point, as shown in FIG. 1.

The method used to form the two layers of material with a high point may be deposition, such as chemical vapor deposition (CVD) and so on. These methods are well known in the field, so the detailed description is omitted.

The lower layer (the second layer) of material is easily corroded material with a high melting point. The melting point of the material is greater than 900° C. because the growth temperature of the GaN material deposited thereafter is greater than 900° C. And the material reacts with acid easily. Preferably, the material may be a $SiO_2$ film. There is no particularly limit for the thickness of the second layer of material film, and a preferable thickness of the material film is 0.2-2 micron, particularly 0.5-1 micron, and more particularly 0.7 micron.

The upper layer (the first layer) of material is also material with a high melting point. The melting point of the material is also greater than 900° C. and the material is stable. The material does not react with acid or alkaline nor has a very slow reaction speed. Preferably, the material may be a $SiN_x$ film. There is no particularly limit for the thickness of the first layer of material film, and a preferable thickness of the material film is 0.2-2 micron, particularly 0.5-1 micron, and more particularly 0.8 micron.

a2) preparing mask on the high melting point material film using photoresist.

Figure 3:
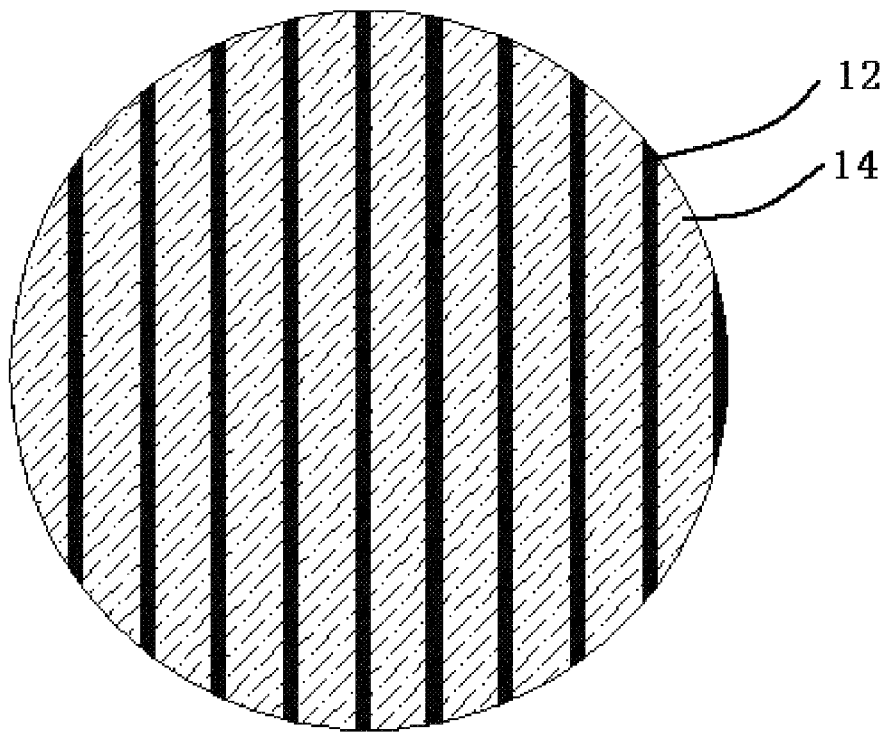

The pattern of the mask may be mesh or stripe. The longitudinal section of the pattern is approximately triangle, as shown in FIG. 3. The size of the longitudinal section of the pattern is not particularly limited, but a preferable bottom width of the section is 0.5-5 micron, particularly 1.5-4 micron, and more particularly 2.5 micron. A preferable height of the section is 0.5-5 micron, particularly 1.5-3 micron, and more particularly 2.0 micron. A preferable distance between the patterns is 0.5-5 micron, particularly 0.5-3 micron, and more particularly 0.5 micron.

a3) transferring the photoresist pattern to the high melting point material film. The pattern may be mesh or stripe.

The method for transferring the photoresist mask pattern may be dry etching.

Preferably, the longitudinal section of the film pattern is approximately triangle. The size of the longitudinal section of the pattern is not particularly limited. But a preferable bottom width of the section is 0.5-5 micron, particularly 1.5-4 micron, and more particularly 2.5 micron. A preferable height of the section is 0.5-5 micron, particularly 1.0-3 micron, and more particularly 1.5 micron. The height of the second layer of high melting point material film is 0.7 micron, and the height of the first layer of high melting point material film is 0.8 micron. A preferable distance between the patterns is 0.5-5 micron, particularly 0.5-3 micron, and more particularly 0.5 micron.

Figure 5:
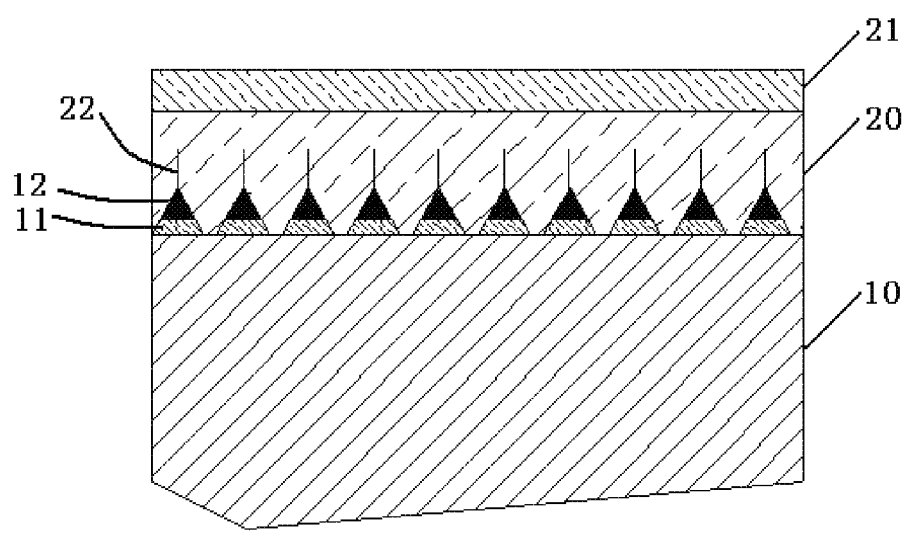

According to a preferable embodiment, in step b), the GaN base light-emitting diode epitaxial layer is growing on the graphical growth substrate through lateral growth. The epitaxial layer includes a N-type GaN layer and a P-type GaN layer. There is a high density defect region forming in the N-type GaN layer and the defects are mainly located above the graphical substrate, namely the top of the triangle patterns, as shown in FIG. 5.

The epitaxial growth of GaN is a well known technology in the field, such as the reference literature S. Nakamura, S. Pearton, and G. Fasoll, The Blue Laser Diode: The complete Story, Berlin, Springer, 2000. For example, grow an N-type GaN layer under a condition that a stoichiometric amount of Ga element is smaller than that of N element, and then grow a P-GaN layer under a condition that a stoichiometric amount of Ga element is greater than that of N element.

According to the method of the present invention, step c) can be carried out by at least two different ways.

In a preferable embodiment of the method of the invention, step c) includes:

c1) etching through the epitaxial layer to expose the sapphire substrate; using an acid solution to remove the second layer of easily corroded material with a high melting point by side etching, the acid solution does not corrode or slowly corrodes the GaN base material and the first layer of stable material with a high melting point.

In an embodiment, a buffered oxide etchant may be used as the acid solution.

c2) etching the epitaxial layer to the N-type GaN layer and the etching surface is tilt.

The etching method may be photo etching and corrosion. For example, the etching depth may be about 1 micron. The etching surface is tilt to enable an angle between the etching surface and the surface of the epitaxial to be 30-60 degree, preferably 40-50 degree, and more preferably 45 degree.

c3) depositing a transparent and electrically conductive film on the P-type GaN layer to form an ohmic contact between the transparent and electrically conductive film and the P-type GaN layer.

The material of the transparent and electrically conductive film is preferably ITO. Preferably, the thickness of the ITO transparent and electrically conductive film is controlled between 500-5000 angstrom, preferably between 1000-4000 angstrom, and more preferably 2000 angstrom by photo etching and corrosion etc., and then anneal it for 30 minutes at a high temperature such as 500° C. to form a good ohmic contact between the transparent and electrically conductive film and the P-type GaN layer.

c4) forming an omni-directional reflection (ODR) layer on the transparent and electrically conductive film and forming holes in the ODR layer.

Figure 10:
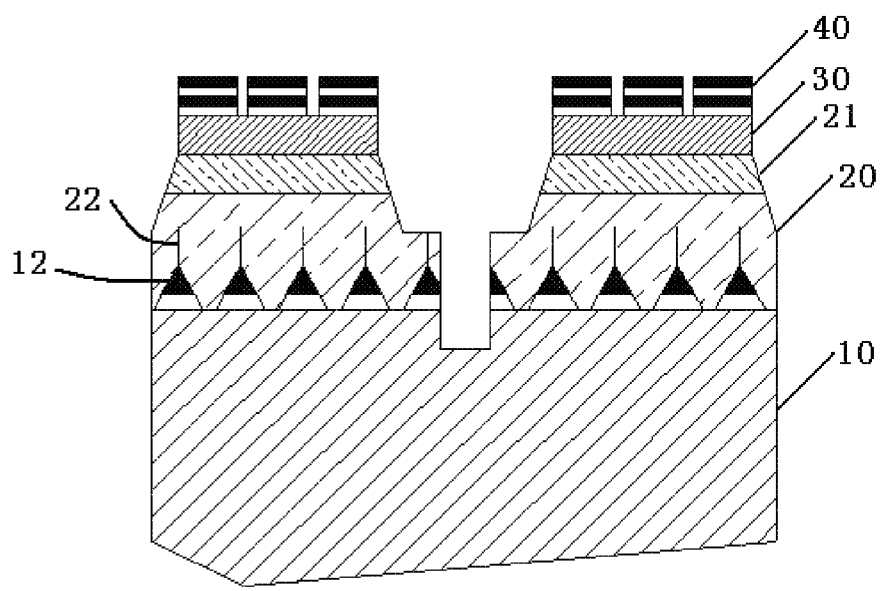

Preferably, the ODR layer is made of SiO2 and/or Ti3O5, and the holes are formed in the ODR layer by photo etching and corrosion, as shown in FIG. 10.

c5) forming a passive film on the etching surface to protect the etching surface.

Preferably, the passive film may be a SiNx film or a SiO2 film.

The method for forming the passive film may be chemical vapor deposition etc. For example, a SiNx film of 2000 angstrom is deposited, and x≈¾. The state and thickness of the passive film can be adjusted by photo etching or corrosion.

c6) forming a metal film on the ODR layer as a conductive reflection layer which is connected with the transparent and electrically conductive film through the holes in the ODR layer.

The method for forming the metal film can be evaporation method, for example, vacuum vapor deposition method.

The metal film used as the conductive reflection layer is preferably formed of metal material with a high reflectivity, and preferably formed of Al. The thickness of the metal film is preferably 3000 angstrom. The thickness of the metal film can be adjusted by photo etching or corrosion.

c7) filling the portion except the metal film as the conductive reflection layer with insulation material.

Preferably, the insulation material has a good thermal stability and has a melting point greater than 200. But it is easily corroded by an acid or alkaline solution, such as polyimide.

c8) forming a passive metal protection layer on the conductive reflection layer and the insulation material to protect the metal conductive reflection layer.

The method for forming the passive metal protection layer may be vacuum deposition method, for example vacuum vapor deposition method and sputtering etc. These methods are well known in the field, so the detailed description is omitted.

Preferably, the material of the passive metal protection layer has a good thermal stability and compactness, such as titanium-tungsten alloy.

For example, a titanium-tungsten alloy layer of 7000 angstrom is formed by sputtering.

c9) forming a metal material layer for binding on the passive metal protection layer.

The method for forming the metal material layer for binding may be vacuum deposition method, for example vacuum vapor deposition method and sputtering etc. These methods are well known in the field, so the detailed description is omitted.

Preferably, the metal material for binding may be Pt/Au, Ti/Au/Sn or Ti/Au.

For example, a Pt layer of 200 angstrom and an Au layer of 25000 angstrom are formed as the metal material layer for binding by vacuum evaporation.

c10) forming a metal material layer for binding on a support substrate with a high thermal conductivity.

The method for forming the metal material layer for binding may be vacuum deposition method, for example vacuum vapor deposition method and sputtering etc. These methods are well known in the field, so the detailed description is omitted.

Preferably, the support substrate having high thermal conductivity may be Si or ceramic material, etc. And the metal material for binding may be Pt/Au/In, Ti/Au/Sn/In or Ti/Au/In.

For example, a Pt layer of 500 angstrom, an Au layer of 5000 angstrom and an In layer of 20000 angstrom are vacuum deposited on a Si wafer as the metal material layer for binding.

c11) binding the element portion having the GaN base epitaxial layer and the support substrate by binding the metal material layers for binding formed in step c9) and step c10).

The binding may be carried out by a binding machine.

Figure 19:
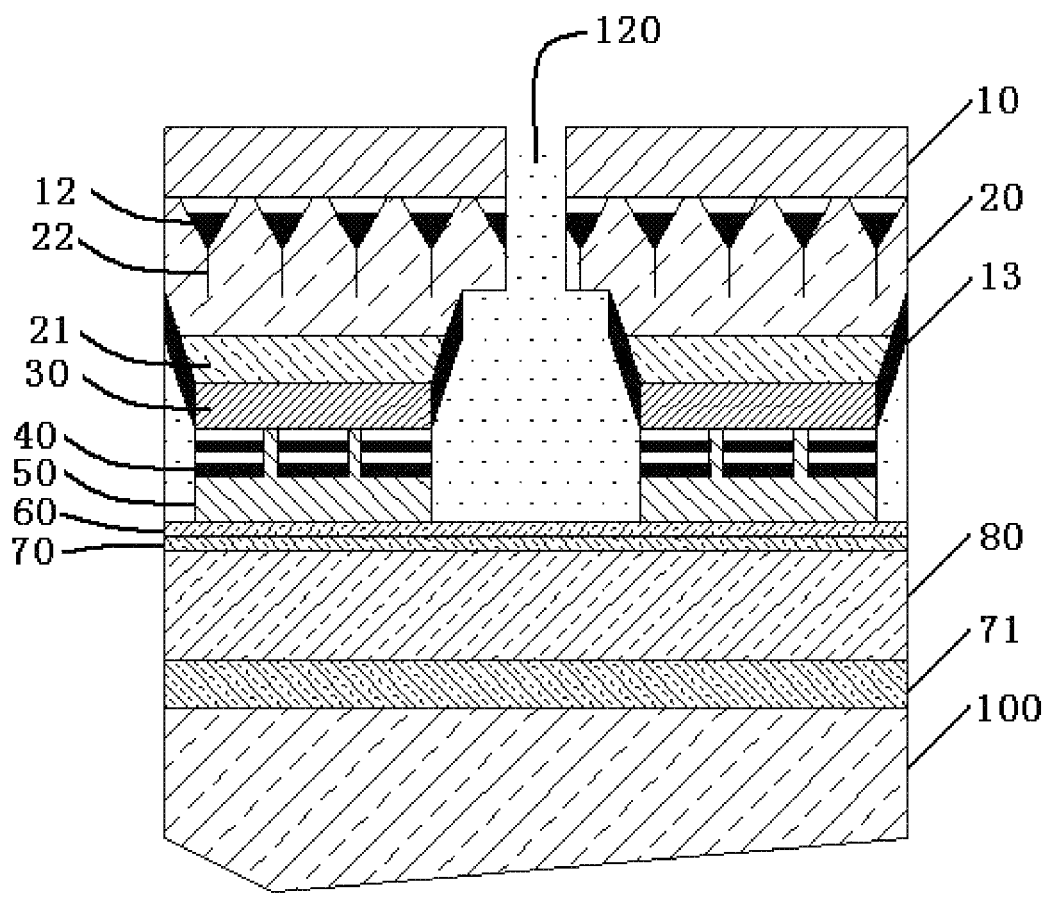

Preferably, the sapphire substrate is thinned to 20-60 micron, particularly 25-40 micron, and more particularly 30 micron by polishing, for example.

c12) slicing the sapphire to the surface of the binding layer with laser along the position filled with the insulation material, as shown in FIG. 19.

c13) putting the sample into an acid or alkaline solution which can corrode the insulation material and the GaN material and cannot corrode the first layer of stable material with a high melting point.

Because the second layer of easily corroded material with a high melting point is removed and cavities are left, the acid or alkaline solution can permeate into the cavities and side etch the GaN between the cavities, and thus stripping the GaN and the sapphire substrate. For example, it can be achieved by putting the sample into a potassium hydroxide solution.

For the high-density defect region in the N-type GaN layer, the acid or alkaline solution cannot corrode the GaN region with high defect density due to the protection of the first layer of stable material with a high melting point, and therefore the entire GaN epitaxial layer is protected.

In another preferable embodiment of the method of the invention, step c) includes:

c1) depositing a transparent and electrically conductive film on the P-type GaN layer to form an ohmic contact between the transparent and electrically conductive film and the P-type GaN layer.

The material of the transparent and electrically conductive film is preferably ITO. Preferably, the thickness of the ITO transparent and electrically conductive film is controlled between 500-5000 angstrom, preferably between 1000-4000 angstrom, and more preferably 2000 angstrom by photo etching and corrosion etc., and then anneal it for 30 minutes at a high temperature such as 500° C. to form a good ohmic contact between the transparent and electrically conductive film and the P-type GaN layer.

c2) etching the transparent and electrically conductive film and the epitaxial layer to the N-type GaN layer and the etching surface is tilt.

The etching method may be photo etching and corrosion. For example, the etching depth may be about 1 micron. The etching surface is tilt to enable an angle between the etching surface and the surface of the epitaxial to be 30-60 degree, preferably 40-50 degree, and more preferably 45 degree.

c3) forming an omni-directional reflection (ODR) layer on the transparent and electrically conductive film and forming holes in the ODR layer.

Preferably, the ODR layer is made of SiO2 and/or Ti3O5. The holes are formed in the ODR layer by photo etching and corrosion, as shown in FIG. 10.

c4) forming a passive film on the etching surface to protect the etching surface.

Preferably, the passive film may be a SiNx film or a $SiO_2$ film.

The method for forming the passive film may be chemical vapor deposition etc. For example, a SiNx film of 2000 angstrom is deposited, and x≈¾. The state and thickness of the passive film can be adjusted by photo etching or corrosion.

c5) forming a metal film on the ODR layer as a conductive reflection layer which is connected with the transparent and electrically conductive film through the holes in the ODR layer.

The method for forming the metal film can be evaporation method, for example, vacuum vapor deposition method.

The metal film used as the conductive reflection layer is preferably formed of metal material with a high reflectivity, and preferably formed of Al. The thickness of the metal film is preferably 5000 angstrom. The thickness of the metal film can be adjusted by photo etching or corrosion.

c6) forming a passive metal protection layer on the conductive reflection layer to protect the metal conductive reflection layer.

The method for forming the passive metal protection layer may be vacuum deposition method, for example vacuum vapor deposition method and sputtering etc. These methods are well known in the field, so the detailed description is omitted.

Preferably, the material of the passive metal protection layer has a good thermal stability and compactness, such as titanium-tungsten alloy.

For example, a titanium-tungsten alloy layer of 7000 angstrom is formed by sputtering.

c7) forming a metal material layer for binding on the passive metal protection layer.

The method for forming the metal material layer for binding may be vacuum deposition method, for example vacuum vapor deposition method and sputtering etc. These methods are well known in the field, so the detailed description is omitted.

Preferably, the metal material for binding may be Pt/Au, Ti/Au/Sn or Ti/Au.

For example, a Pt layer of 300 angstrom and an Au layer of 30000 angstrom are formed as the metal material layer for binding by vacuum evaporation.

c8) forming a metal material layer for binding on a support substrate with a high thermal conductivity.

The method for forming the metal material layer for binding may be vacuum deposition method, for example vacuum vapor deposition method and sputtering etc. These methods are well known in the field, so the detailed description is omitted.

Preferably, the support substrate having high thermal conductivity may be Si or ceramic material, etc. And the metal material for binding may be Pt/Au/In, Ti/Au/Sn/In or Ti/Au/In.

For example, a Pt layer of 300 angstrom, an Au layer of 3000 angstrom and an In layer of 30000 angstrom are vacuum deposited on a Si wafer as the metal material layer for binding.

c9) binding the element portion having the GaN base epitaxial layer and the support substrate by binding the metal material layers for binding formed in step c7) and step c8).

The binding may be carried out by a binding machine.

Figure 39:
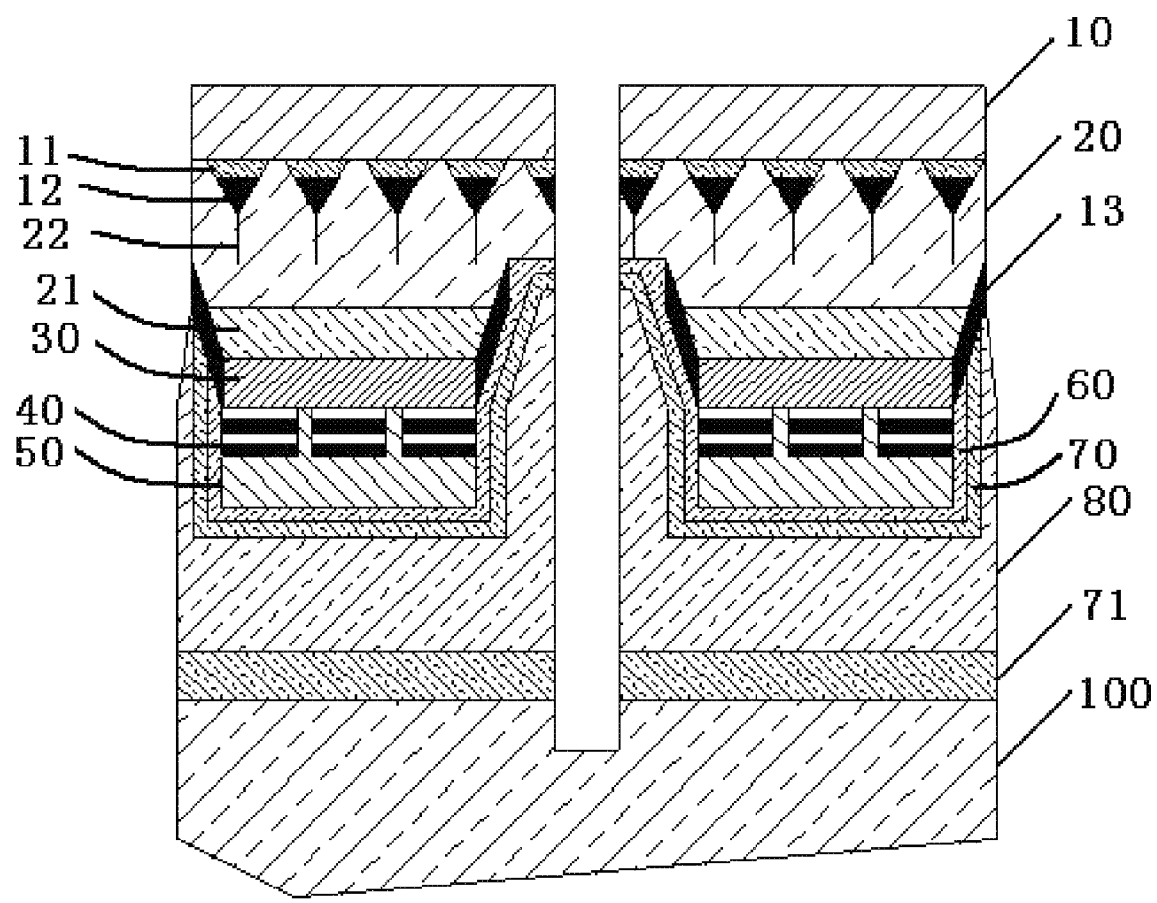

Preferably, the sapphire substrate is thinned to 20-60 micron, particularly 25-40 micron, and more particularly 30 micron by polishing, for example.

c10) slicing the sapphire at least to the surface of the binding layer with laser along the etching position in step c2), as shown in FIG. 39.

c11) putting the sample into an acid or alkaline solution which can corrode the second layer of easily corroded material with a high melting point on the substrate to remove the second layer of material and keeping cavities left. The solution does not corrode or slowly corrodes the GaN base material and the first layer of stable material with a high melting point.

In an embodiment, a buffered oxide etchant may be used as the acid solution.

c12) putting the sample into an acid or alkaline solution which can corrode the insulation material and the GaN material and cannot corrode the first layer of stable material with a high melting point.

Because the second layer of easily corroded material with a high melting point is removed and cavities are left, the acid or alkaline solution can permeate into the cavities and side etch the GaN between the cavities, and thus stripping the GaN and the sapphire substrate. For example, it can be achieved by putting the sample into a potassium hydroxide solution.

For the high-density defect region in the N-type GaN layer, the acid or alkaline solution cannot corrode the GaN region with high defect density due to the protection of the first layer of stable material with a high melting point, and therefore the entire GaN epitaxial layer is protected.

According to a preferable embodiment of the method of the invention, step d) includes:

d1) removing the first layer of stable material with a high melting point by dry etching;

d2) etching the GaN base material, preferably until the thickness of the N-type GaN layer is decreased to 1.5 micron;

d3) preparing an N electrode by lift-off technology to obtain the final device structure.

The material of the N electrode may be TiAl, CrAu or CrPtAu.

The invention uses a solution to remove the second layer of easily corroded material with a high melting point by side etching to form cavities, and inject another solution into the cavities to corrode part of the GaN base epitaxial layer so as to strip the sapphire substrate and part of the GaN base epitaxial layer by a wet process. The method causes no damage to the epitaxial layer and the performance of the obtained light-emitting diode is good. During the process of the another solution corroding the GaN base epitaxial layer, the first layer of stable material with a high melting point can protect the GaN epitaxial layer above the pattern from corroding, which can further improve the yield and the reliability of the device.

According to another aspect, there is provided a light-emitting diode having a vertical structure prepared by the above method. The light-emitting diode having a vertical structure successively includes:

a support substrate 100 with a high thermal conductivity, a binding layer, a passive metal protection layer 60, a conductive reflection layer 59, an omni-directional reflection layer 40, a transparent and electrically conductive film 30, a GaN base epitaxial layer and an N electrode 110; and the conductive reflection layer 59 is connected with the transparent and electrically conductive film through holes in the omni-directional reflection layer 40, the GaN base epitaxial layer successively includes P-type GaN layer 21 and a N-type GaN layer 20.

According to a preferable embodiment of the light-emitting diode having a vertical structure of the invention, the GaN base epitaxial layer includes a N-type GaN layer and a P-type GaN layer 21, a high-density defect region 22 is formed in the N-type GaN layer.

According to another preferable embodiment of the light-emitting diode having a vertical structure of the invention, a tilt etching surface is formed on the side portion of the transparent and electrically conductive film 30 and the GaN base epitaxial layer, and a passive film 13 is formed on the etching surface. Preferably, the passive film is SiNx.

According to another preferable embodiment of the light-emitting diode having a vertical structure of the invention, the support substrate 100 having a high thermal conductivity may be made of Si or ceramic material, etc.

According to another preferable embodiment of the light-emitting diode having a vertical structure of the invention, the binding layer may be Pt/Au/In/Pt or Ti/AuSn/Ti.

The light-emitting diode having a vertical structure of the invention has good heat dissipation performance, increased extraction efficiency and uniform current distribution.

The invention will be further described using embodiments. It will be appreciated that the embodiments are exemplary and should not be explained to a constraint to the protection scope of the invention.

EXAMPLE 1

As shown in FIG. 1, a SiO2 film of 7000 angstrom and a SiNx film 12 of 8000 angstrom are respectively deposited on a sapphire substrate 10 by chemical vapor deposition.

Figure 2:
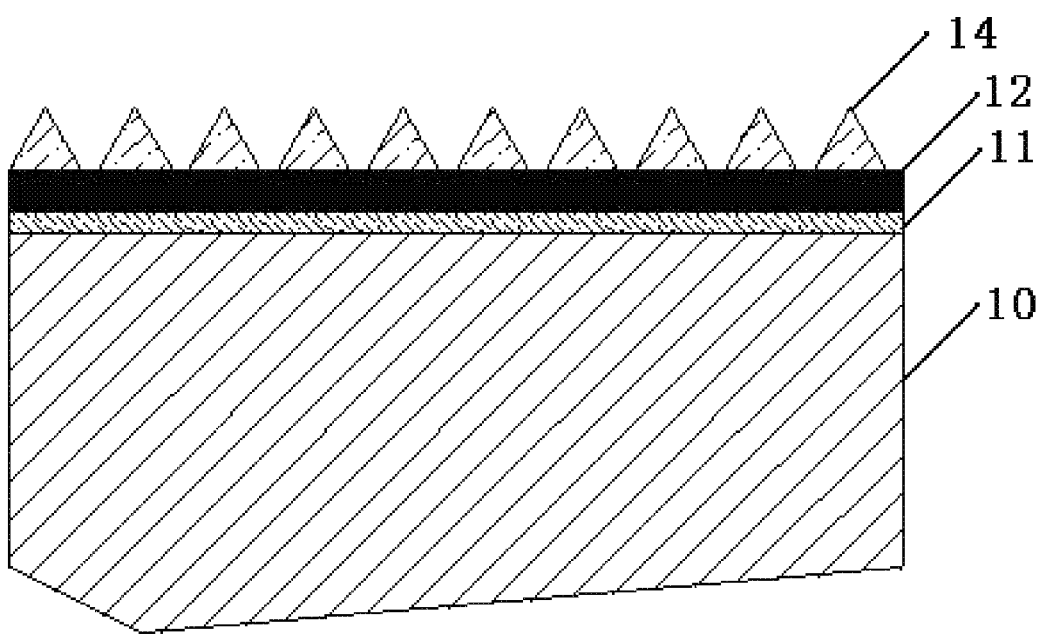

As shown in FIG. 2, a stripe mask pattern is prepared in the SiNx film using photoresists. The section of a stripe pattern is approximately triangle, and the bottom width of the section is 2.4 micron, the height of the section is 2 micron, the distance between two adjacent stripe patterns is 0.6 micron. The vertical view is illustrated in FIG. 3.

Figure 4:
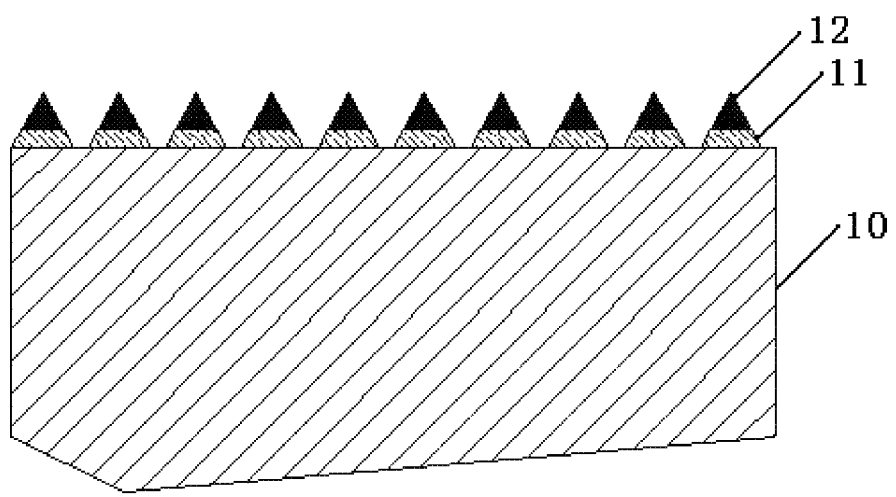

As shown in FIG. 4, the pattern of the photoresists is transferred to the SiNx film and the SiO2 film to form a graphical substrate by dry etching. The section of the stripe pattern is approximately triangle, and the bottom width of the section is 2.5 micron, the height of the section is 1.5 micron. A thickness of the SiO2 film is 0.7 micron, and a thickness of the SiNx film is 0.8 micron.

As shown in FIG. 5, growing a GaN base light-emitting diode epitaxial layer including a N-type layer 20 and a P-type layer 21 on the graphical substrate by vapor deposition. A high-density defect region 22 is formed above the pattern of the substrate due to the use of lateral growth.

Figure 6:
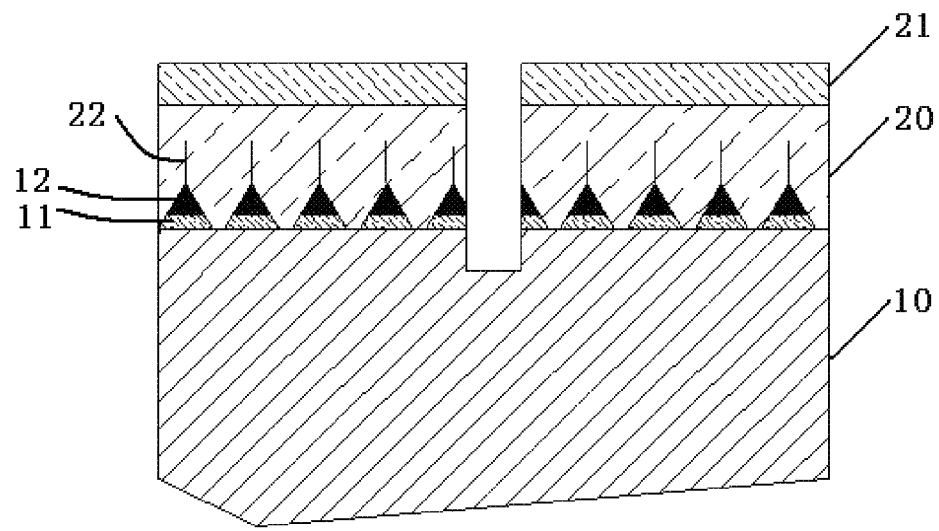

As shown in FIG. 6, the epitaxial layer at scribing grooves is etching through to expose the sapphire substrate 10.

Figure 7:
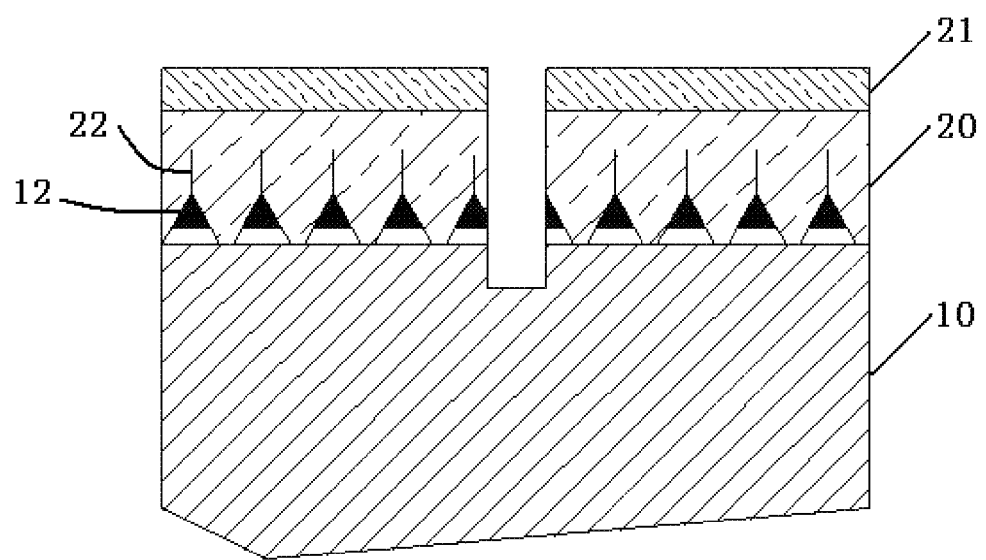

As shown in FIG. 7, the sample is put into a buffer oxidation etching agent to remove the SiO2 film 11 under the epitaxial layer and keep the SiNx film 12 left by side etching.

Figure 8:
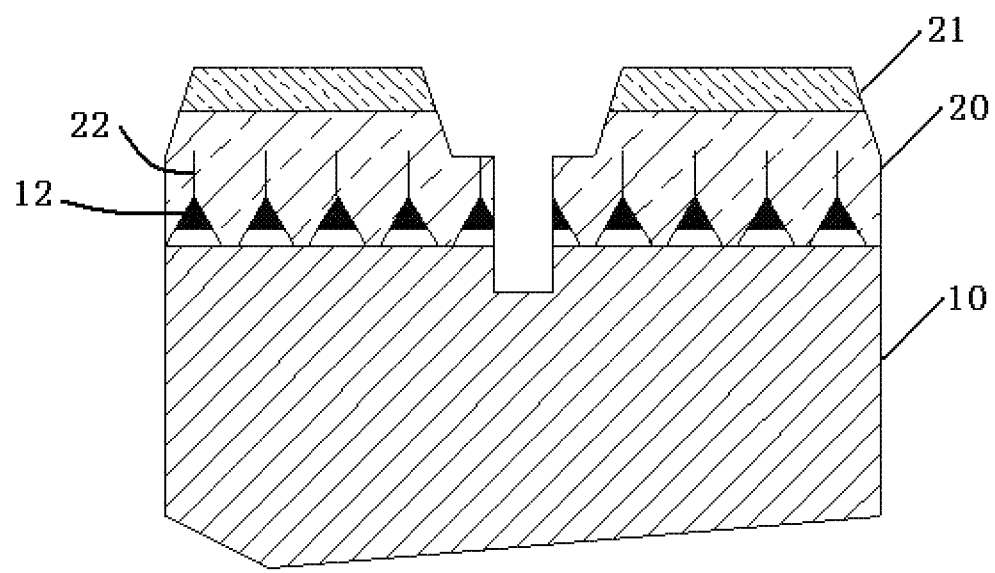

The epitaxial layer is etched to the N-type GaN layer by photo etching or corrosion. The etching depth is about 1 micron, and the etching surface is tilt to form an angle of 45 degree between the etching surface and the surface of the epitaxial layer, as shown in FIG. 8.

Figure 9:
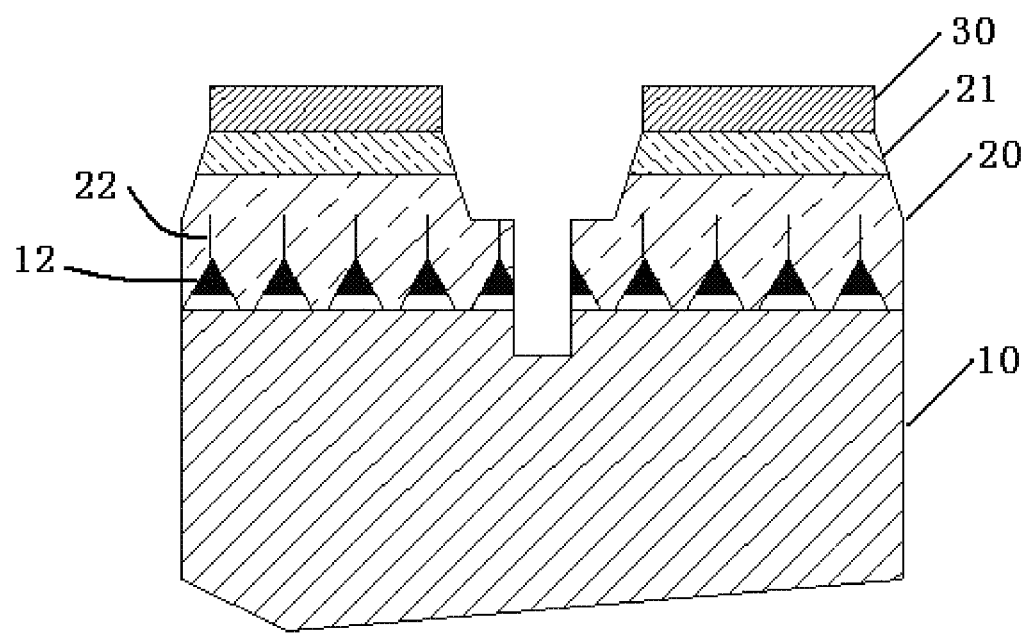

An ITO film 30 of 2000 angstrom is formed on the P-type GaN layer by depositing ITO and photo etching or corrosion, as shown in FIG. 9. And then anneal it for 30 minutes at 500° C. to form a good ohmic contact between the ITO and the P-type GaN.

Figure 11:
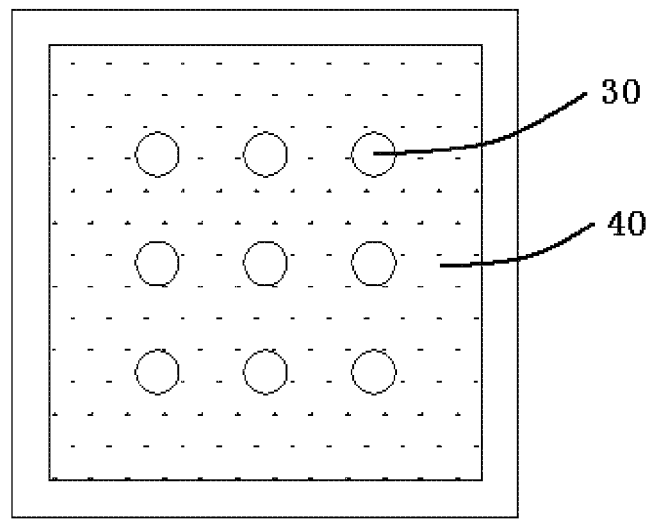

An ODR (omni-directional reflection) layer 40 formed of SiO2 and Ti3O5 is prepared on the ITO film, and holes are formed in the ODR layer 40 by photo etching or corrosion, as shown in FIG. 10. A vertical view of this structure is shown in FIG. 11.

Figure 12:
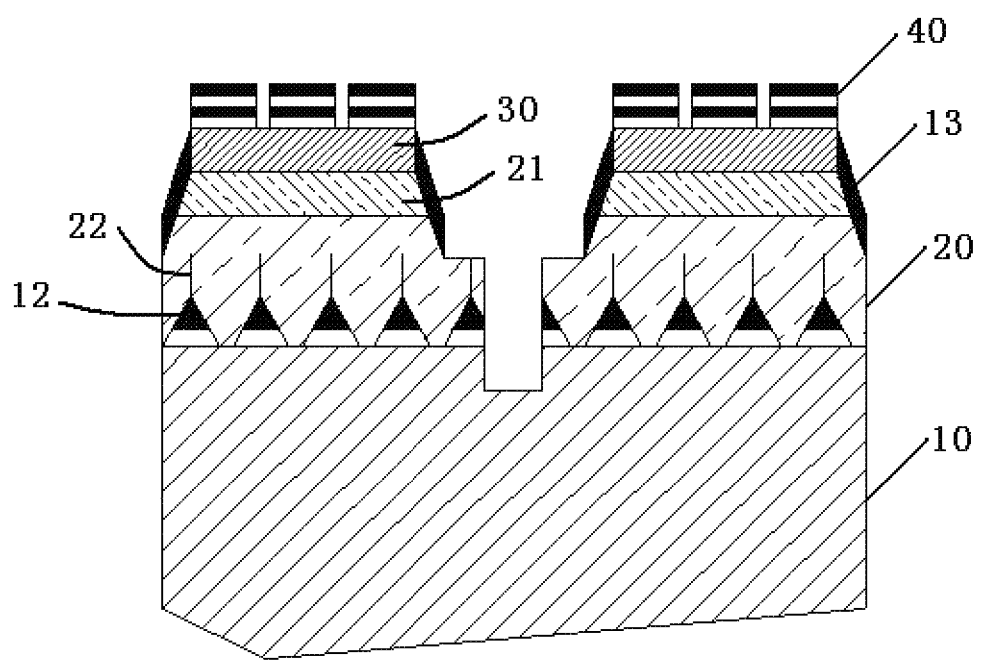

A SiNx film 13 of 2000 angstrom is deposited and then photo etched or corroded to form a structure shown in FIG. 12 to protect the tilt etching surface.

Figure 13:
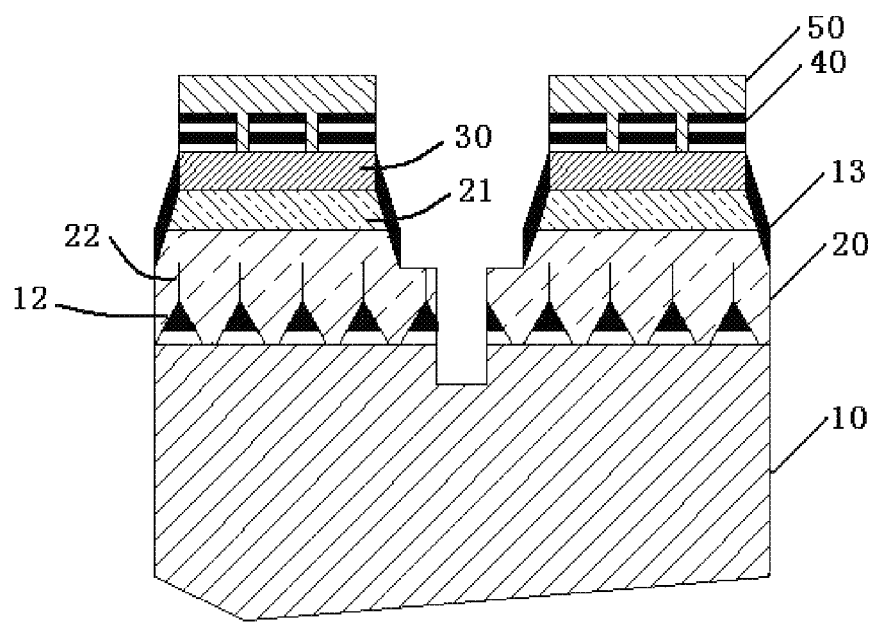

An Al layer 50 of 3000 angstrom is vaporized and then photo etched or corroded to form a structure shown in FIG. 13. The Al layer 50 is connected with the ITO through the holes in the ODR layer.

Figure 14:
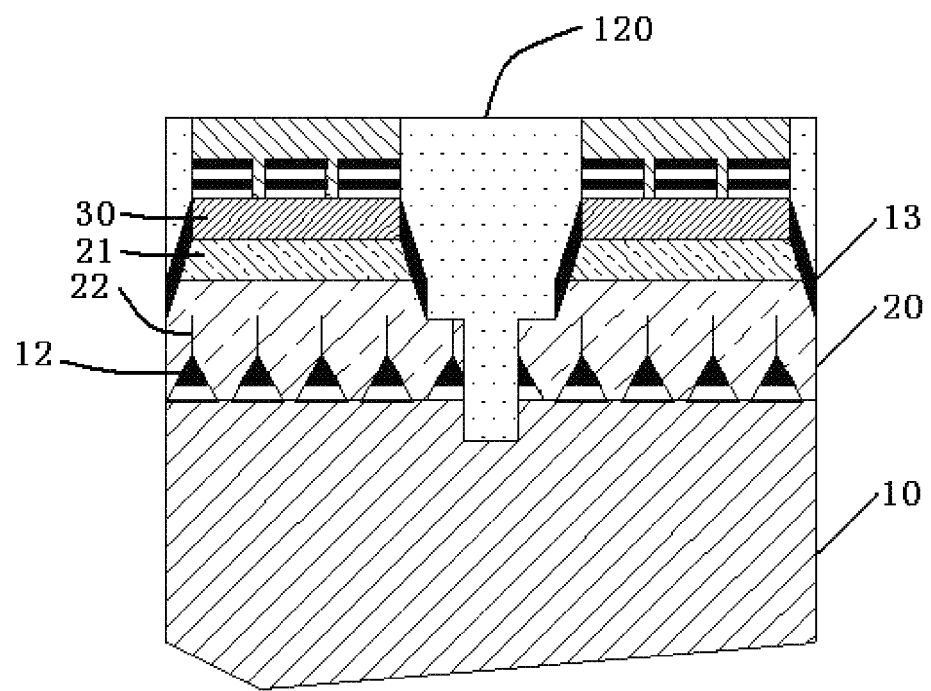

Insulation material polyimide 120 is filled, and the polyimide on the Al is corroded to form a structure shown in FIG. 14.

Figure 15:
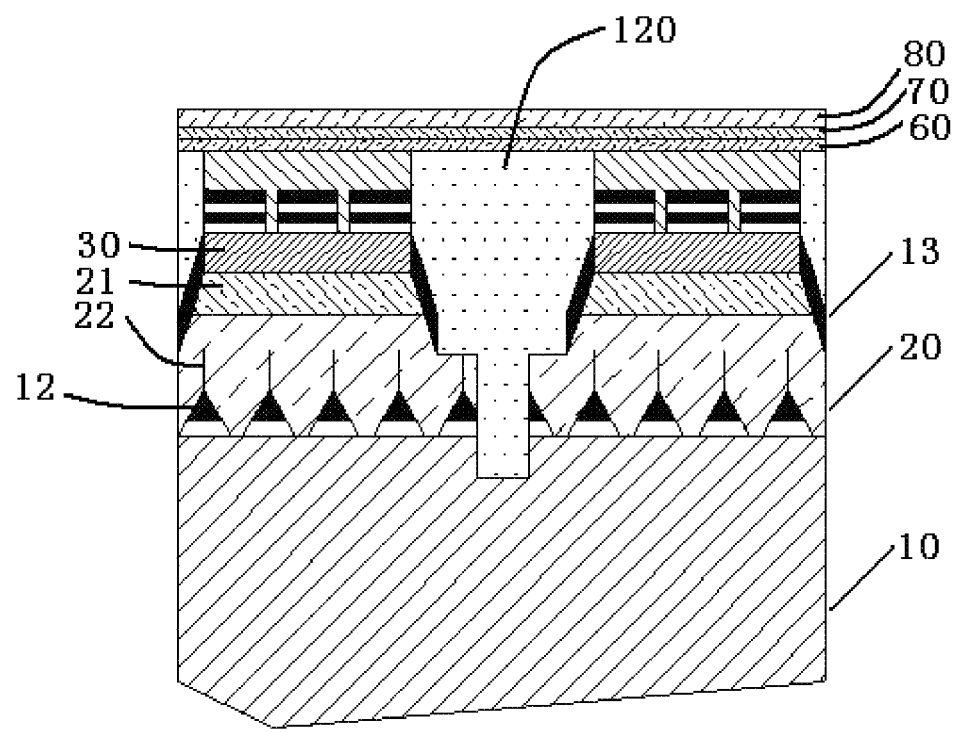

A titanium-tungsten alloy layer 60 of 7000 angstrom is formed by sputtering to protect the reflection layer, as shown in FIG. 15.

A Pt layer 70 of 200 angstrom and an Au layer 80 of 25000 angstrom are formed by vaporizing and to be used as binding materials, as shown in FIG. 15.

Figure 16:
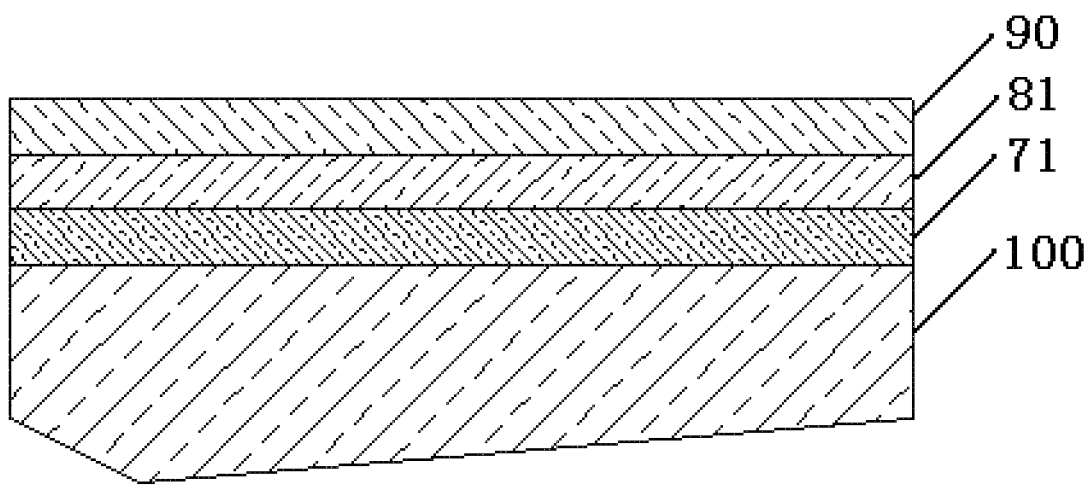

A Pt layer 71 of 500 angstrom, an Au layer 81 of 5000 angstrom and an In layer 90 of 20000 angstrom are deposited on a Si wafer 100 and to be used as binding materials, as shown in FIG. 16.

Figure 17:
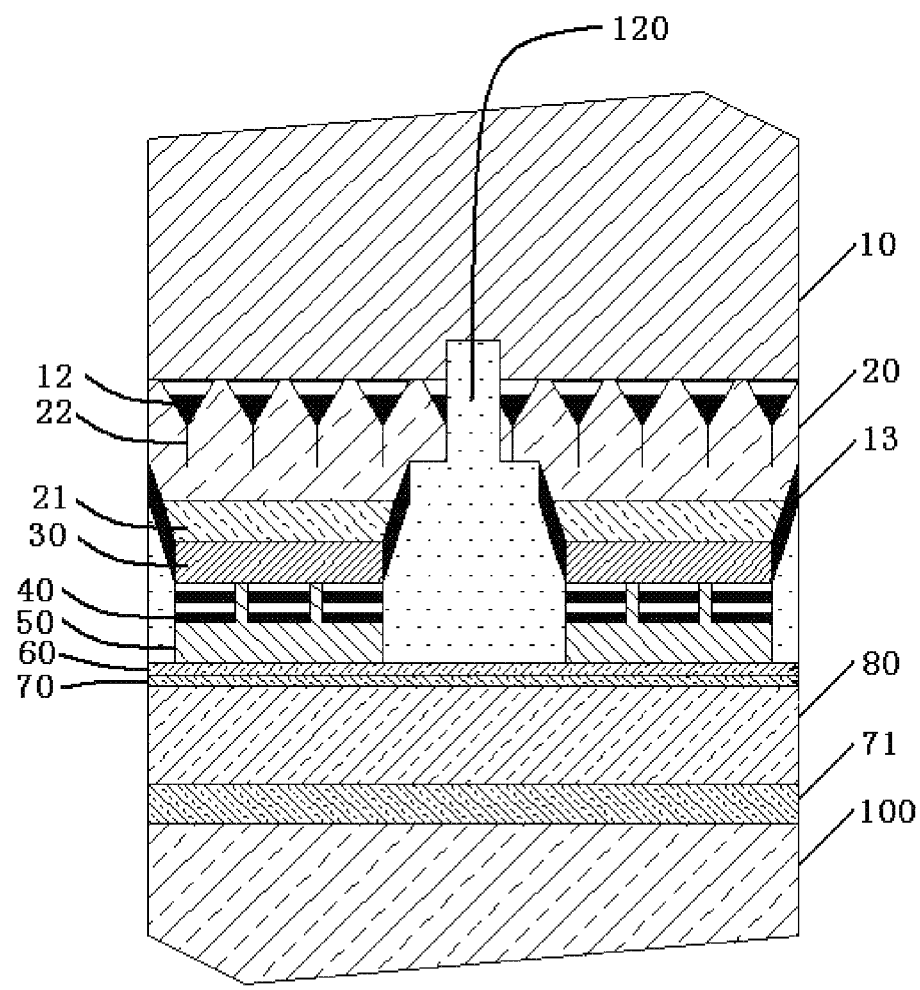

The GaN and the Si wafer are binded with each other by a binding machine to form a structure shown in FIG. 17.

Figure 18:
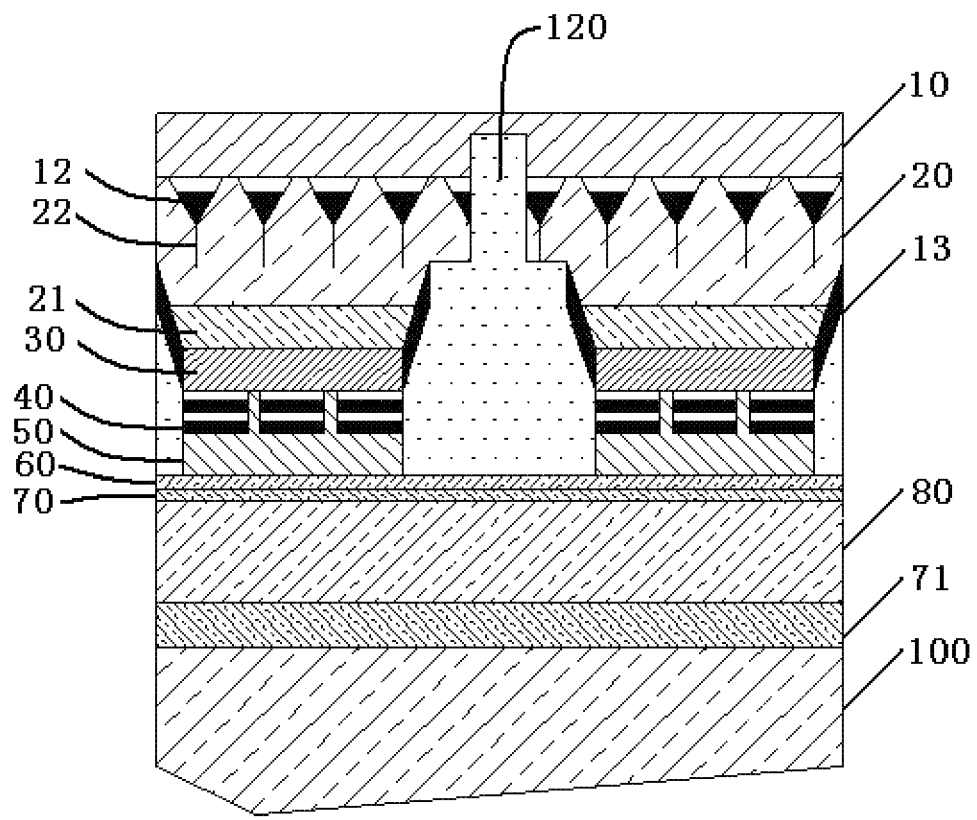

The sapphire substrate 10 is thinned and polished to 35 micron, as shown in FIG. 18.

The sapphire substrate is sliced along the scribing groove by laser, as shown in FIG. 19.

Figure 20:
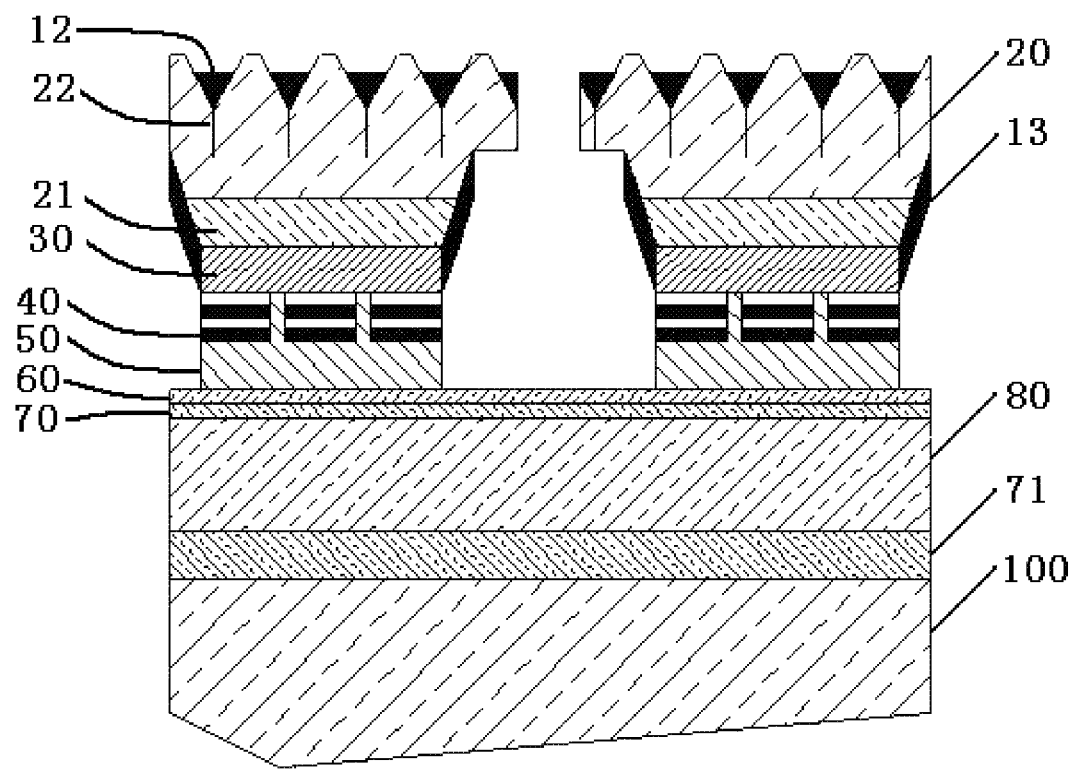

The sample is put into a potassium hydroxide solution to remove the polyimide 120. Because the SiO2 11 of the graphical substrate is removed and cavities are left, the potassium hydroxide solution can permeate into the cavities and side etch the GaN between the cavities, and thus stripping the GaN and the sapphire substrate. Although the GaN defects are located above the SiNx, the potassium hydroxide solution cannot corrode the GaN region 22 with a high defection density because of the protection of the SiNx, and therefore the entire GaN epitaxial layer is protected. A structure shown as in FIG. 20 is formed.

Figure 21:
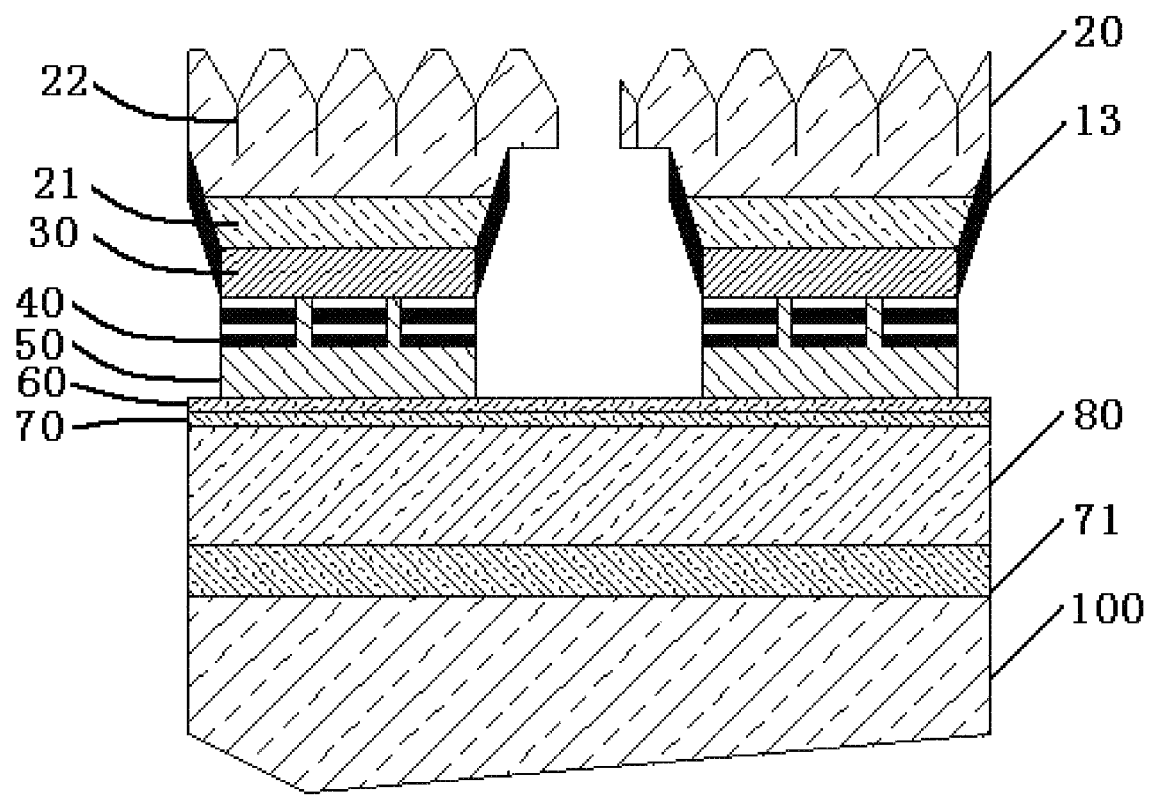

The SiNx film 12 is removed by dry etching, as shown in FIG. 21.

Figure 22:
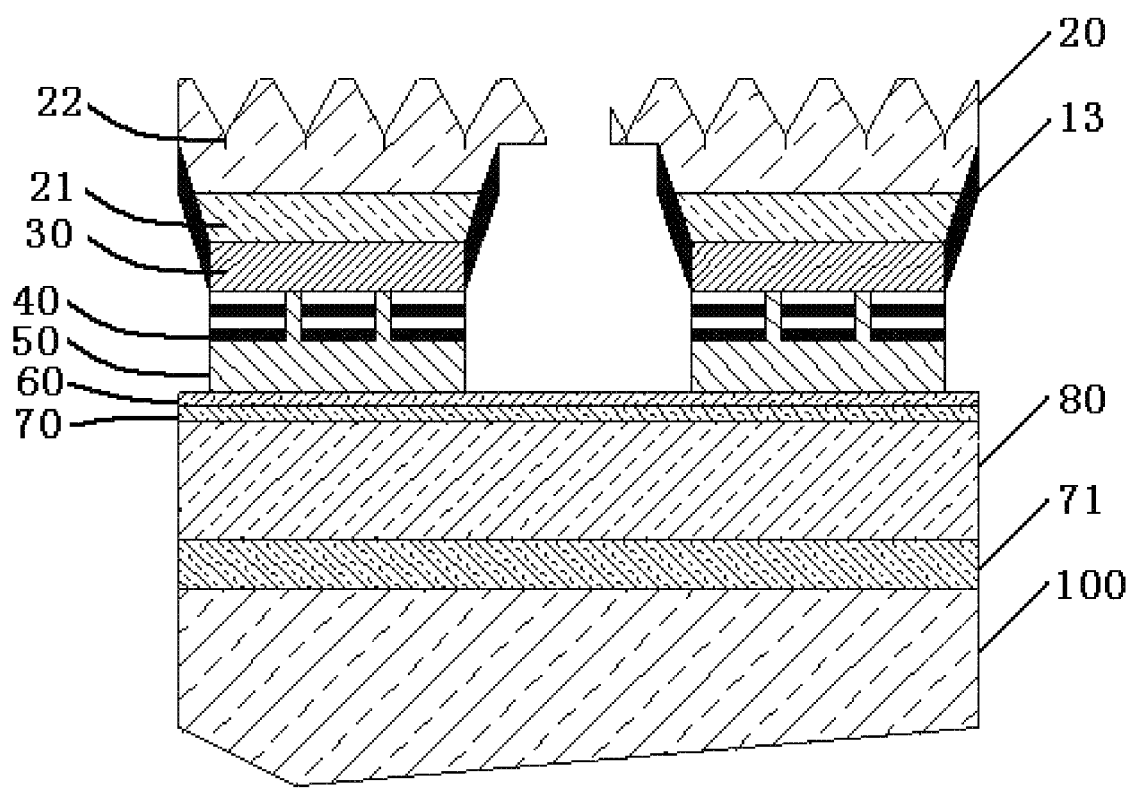

The N-type GaN layer 20 is etched until the thickness of the N-type GaN layer is 1.5 micron, as shown in FIG. 22.

Figure 23:
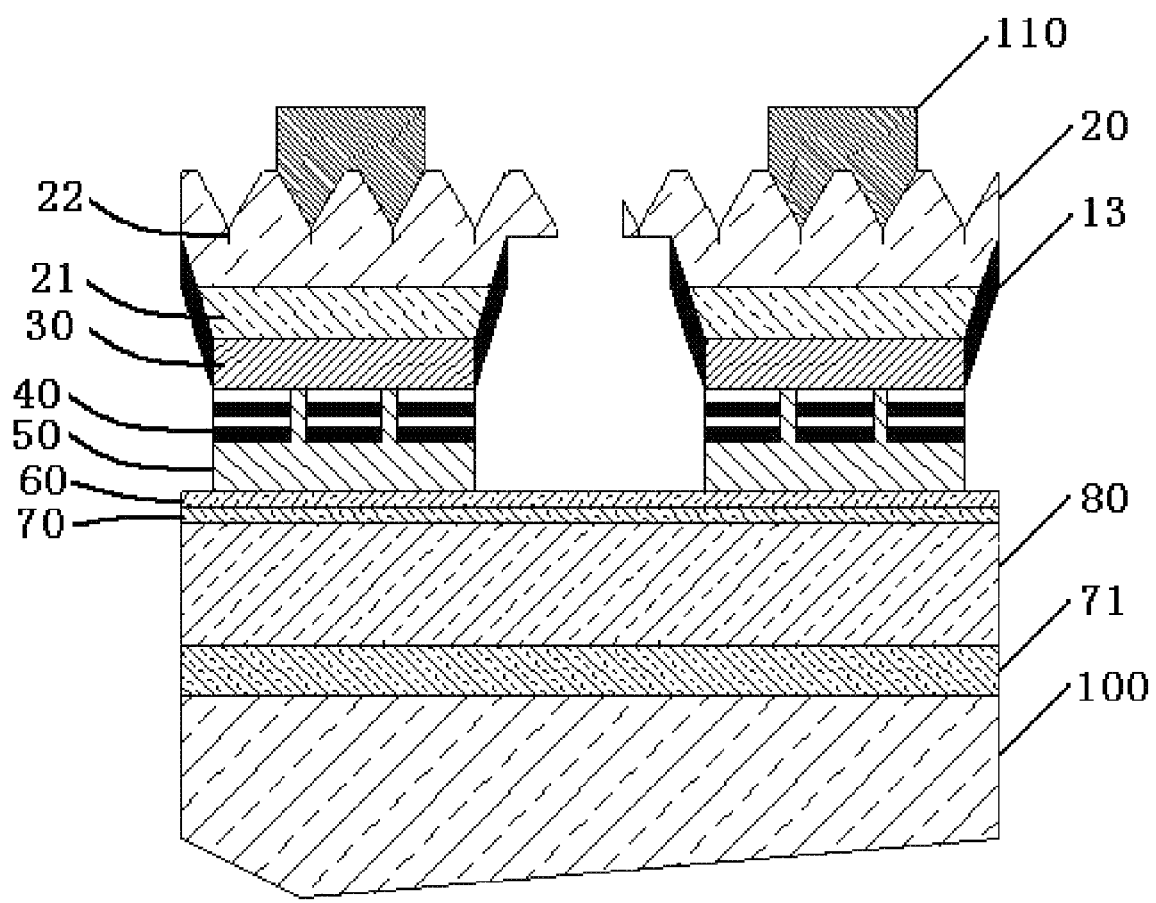

N electrodes 110 are prepared using Cr—Au material by lift-off technology to obtain the final light-emitting diode having a vertical structure, as shown in FIG. 23.

EXAMPLE 2

Figure 24:
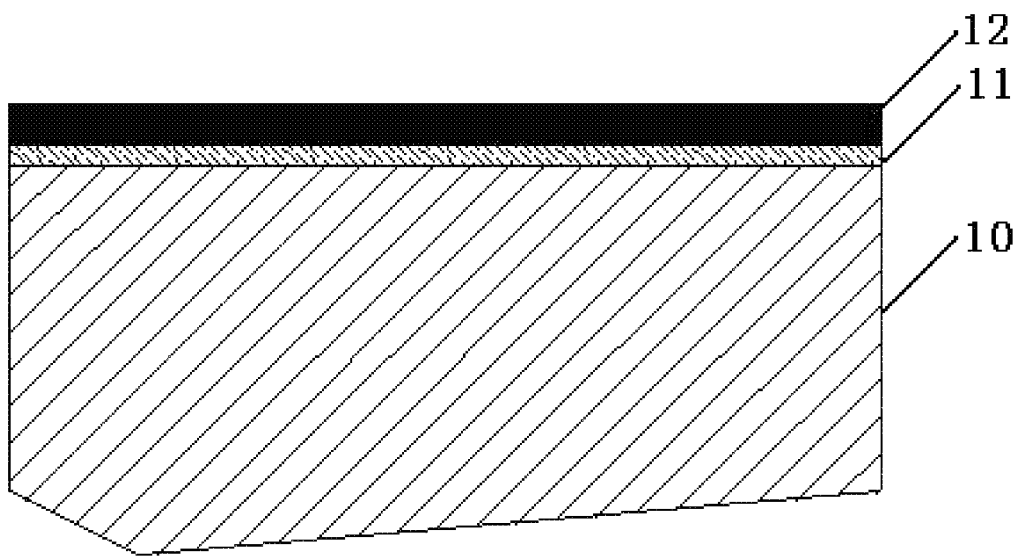
FIGS. 24-44 are schematic views illustrating a method for preparing a light-emitting diode having a vertical structure according to a second embodiment of the present invention.

As shown in FIG. 24, a SiO2 film 11 of 10000 angstrom and a SiNx film 12 of 8000 angstrom are respectively deposited on a sapphire substrate 10.

Figure 25:
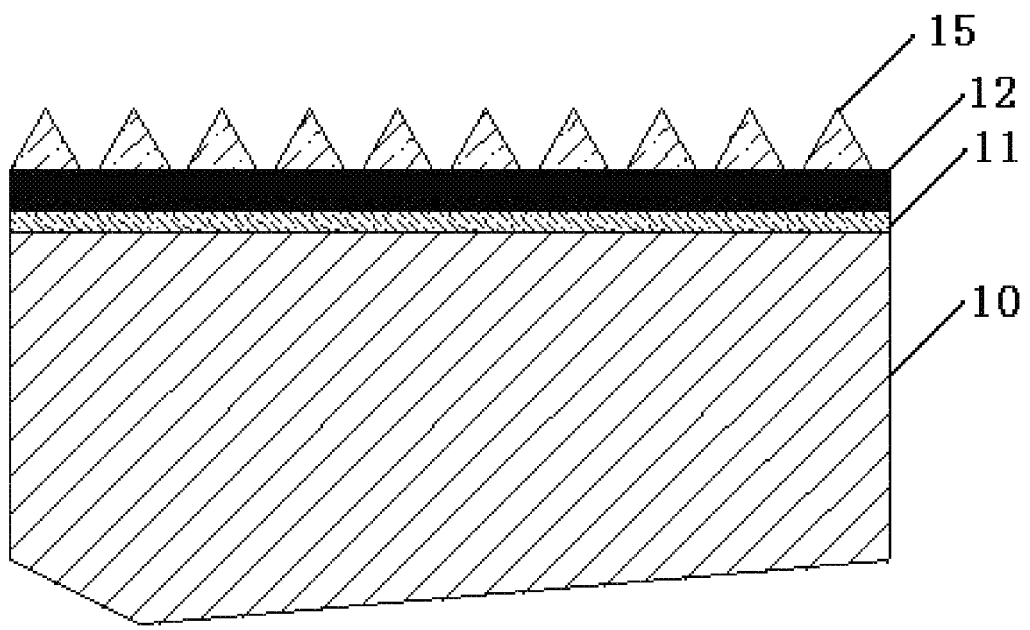
Figure 26:
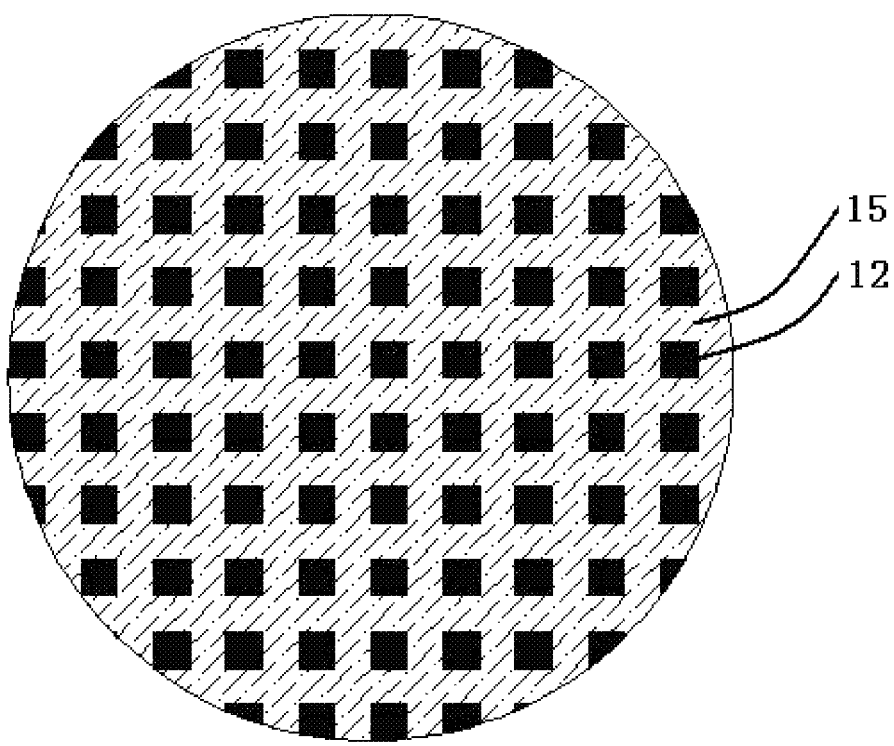

As shown in FIG. 25, a mesh mask pattern is prepared in the SiNx film using photoresists. The section of the mask is approximately triangle, and the bottom width of the section is 2.4 micron, the height of the section is 2.5 micron, the distance between two adjacent stripe patterns is 0.8 micron. The vertical view is illustrated in FIG. 26.

Figure 27:
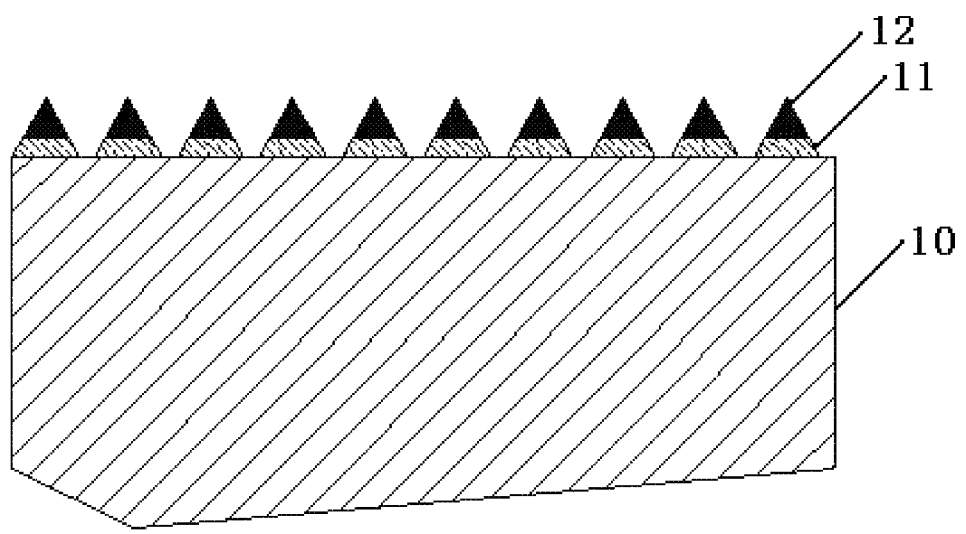

As shown in FIG. 27, the pattern of the photoresists is transferred to the SiO2 film and the SiNx film by dry etching to form a mesh pattern. The section of the pattern is approximately triangle, and the bottom width of the section is 2.4 micron, the height of the section is 1.8 micron. A thickness of the SiO2 film is 1.0 micron, and a thickness of the SiNx film is 0.8 micron.

Figure 28:
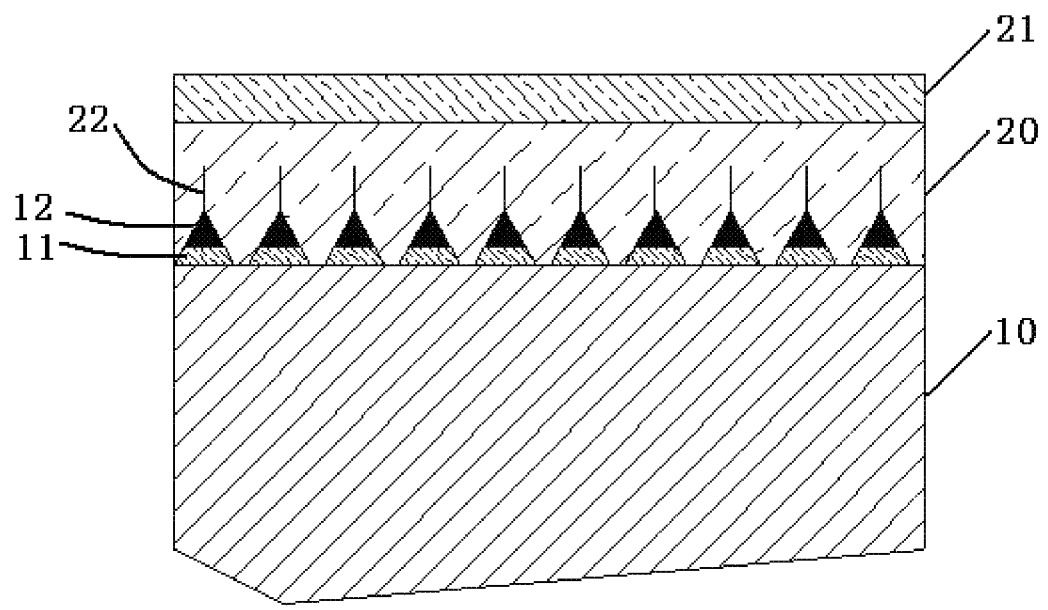

As shown in FIG. 28, growing a GaN base light-emitting diode epitaxial layer including a N-type layer 20 and a P-type layer 21 on the graphical substrate by vapor deposition. A high-density defect region 22 is formed above the pattern of the substrate due to the use of lateral growth.

Figure 29:
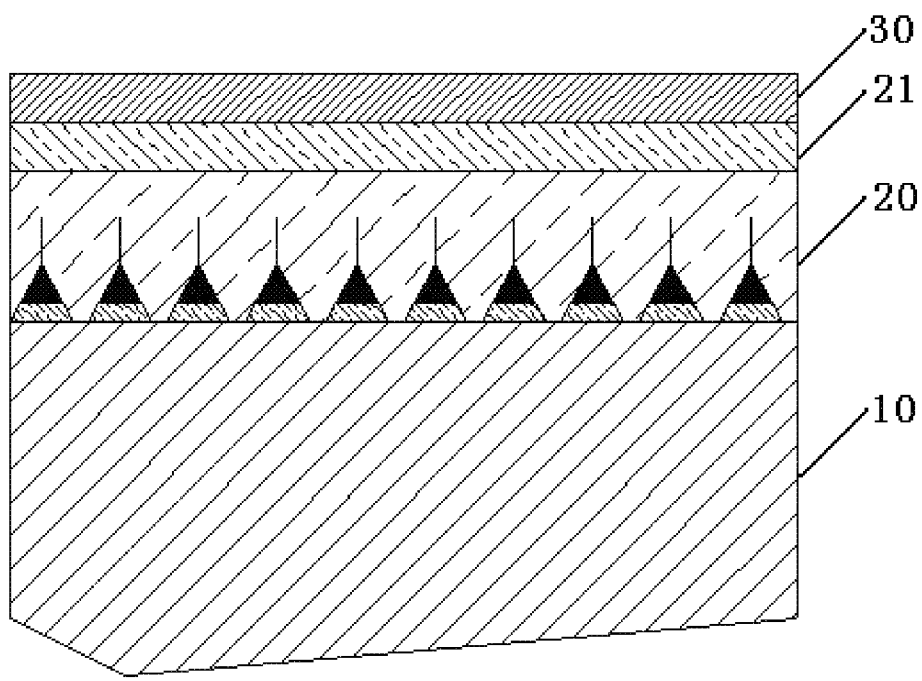

An ITO film 30 of about 2500 angstrom is deposited, as shown in FIG. 29.

Figure 30:
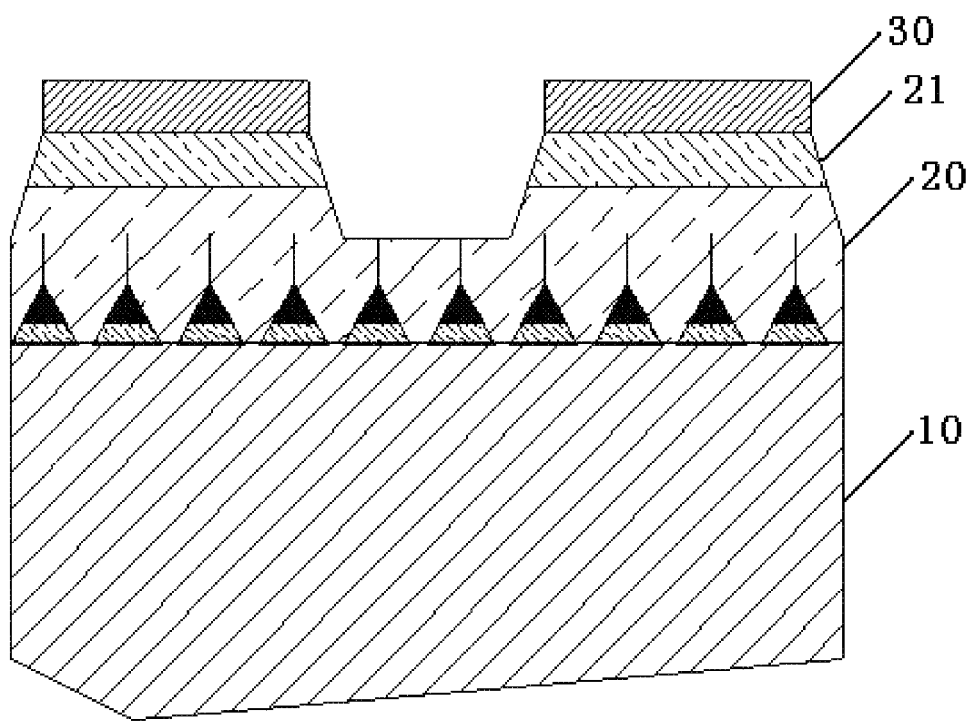

The epitaxial layer is etched to the N-type GaN. The etching depth is about 1 micron, and the etching surface is tilt to form an angle of 45 degree between the etching surface and the surface of the epitaxial layer. Only the ITO film 30 on the P-type GaN is left after photo etching or corrosion, as shown in FIG. 30. and then anneal it for 30 minutes at 500° C. to form a good ohmic contact between the ITO and the P-type GaN.

Figure 31:
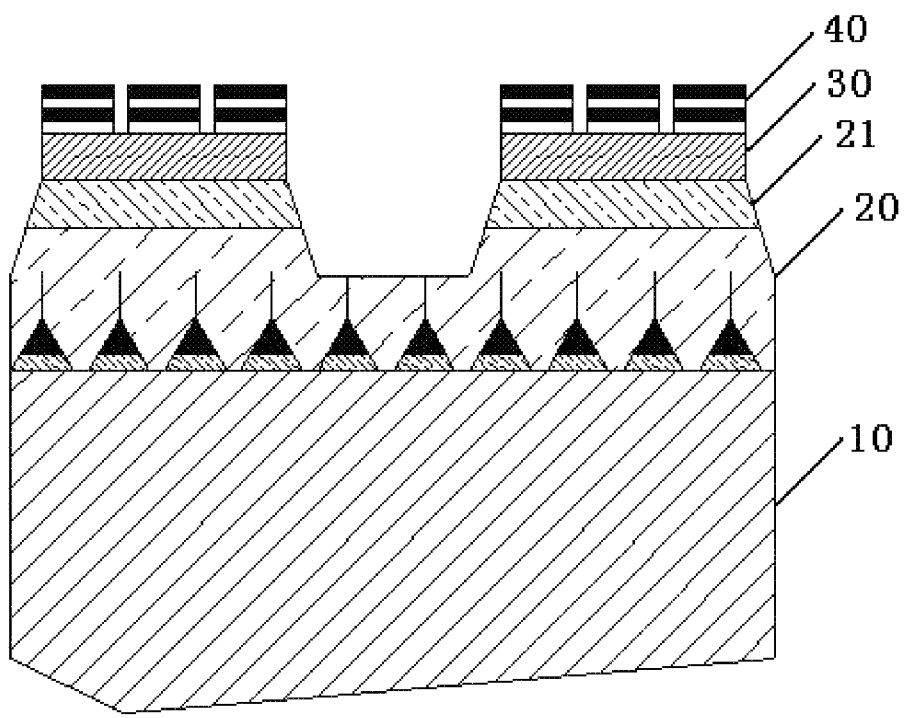
Figure 32:
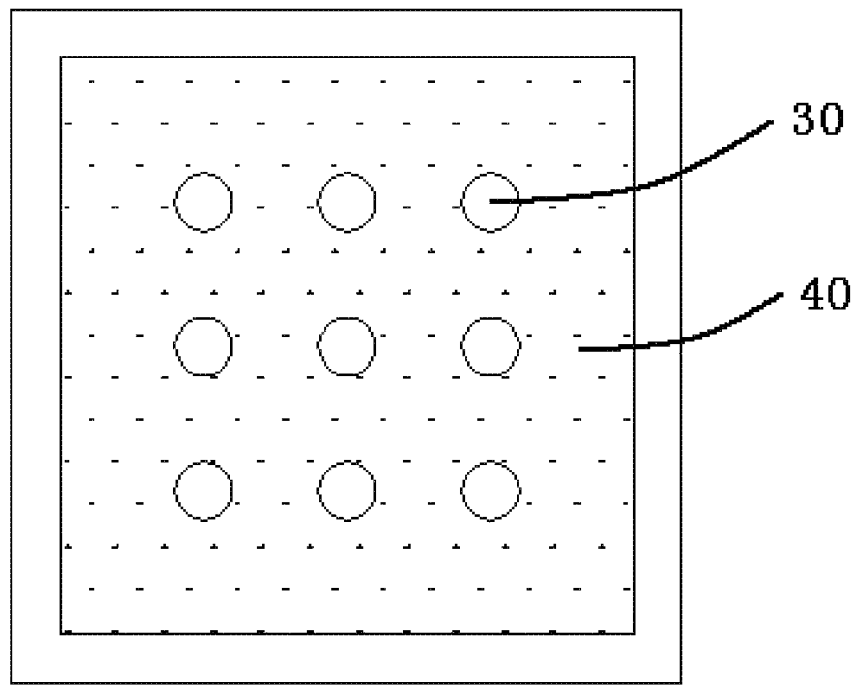

An ODR (omni-directional reflection) layer 40 formed of SiO2 and Ti3O5 is prepared on the ITO film, and holes are formed in the ODR layer 40 by photo etching or corrosion, as shown in FIG. 31. A vertical view of this structure is shown in FIG. 32.

Figure 33:
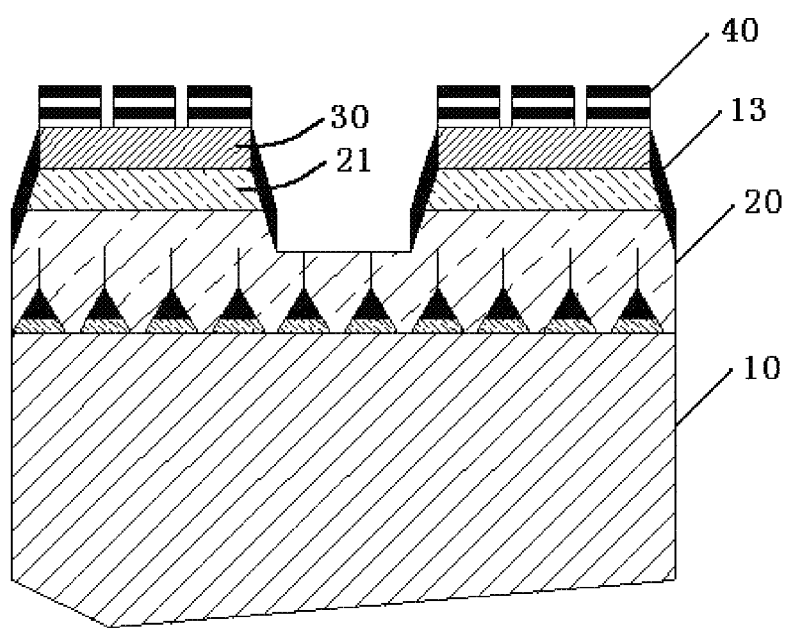

A SiNx film 13 of 1500 angstrom is deposited and then photo etched or corroded to form a structure shown in FIG. 33 to protect the tilt etching surface.

Figure 34:
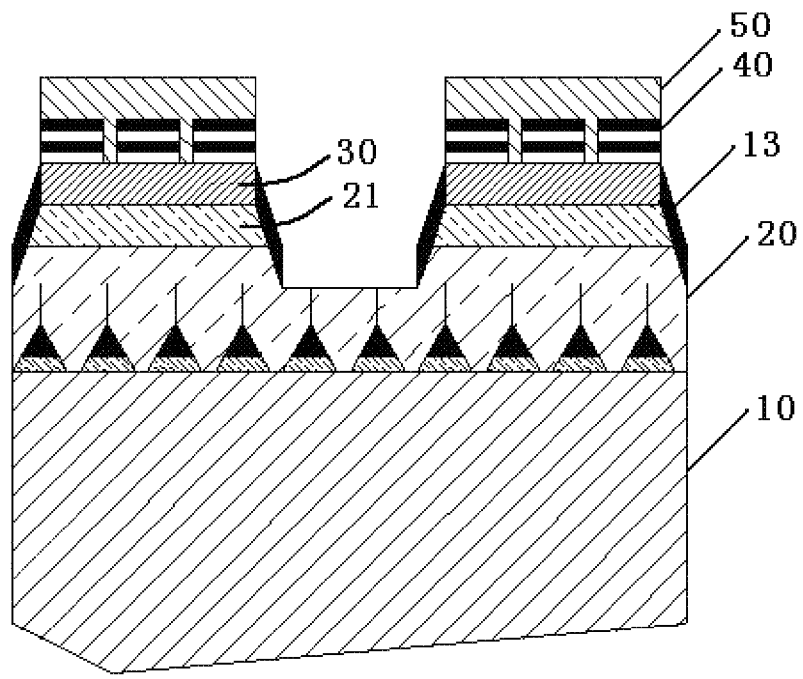

An Al layer 50 of 5000 angstrom is vaporized and then photo etched or corroded to form a structure shown in FIG. 34. The Al layer 50 is connected with the ITO through the holes in the ODR layer.

Figure 35:
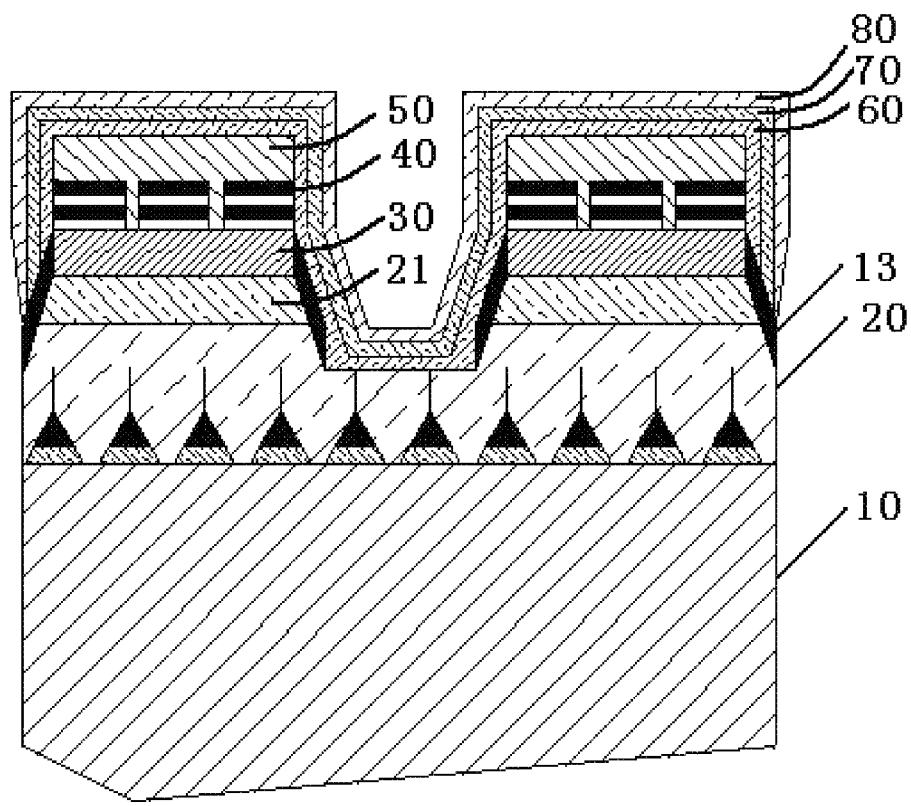

A titanium-tungsten alloy layer 60 of 7000 angstrom is formed by sputtering to protect the reflection layer. A Pt layer 70 of 300 angstrom and an Au layer 80 of 30000 angstrom are formed by vaporizing and to be used as binding materials, as shown in FIG. 35.

Figure 36:
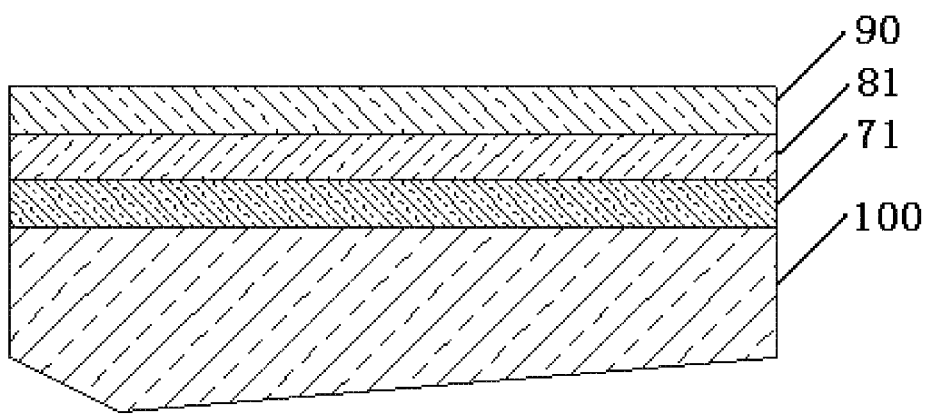

A Pt layer 71 of 300 angstrom, an Au layer 81 of 3000 angstrom and an In layer 90 of 30000 angstrom are deposited on a Si wafer 100 and to be used as binding materials, as shown in FIG. 36.

Figure 37:
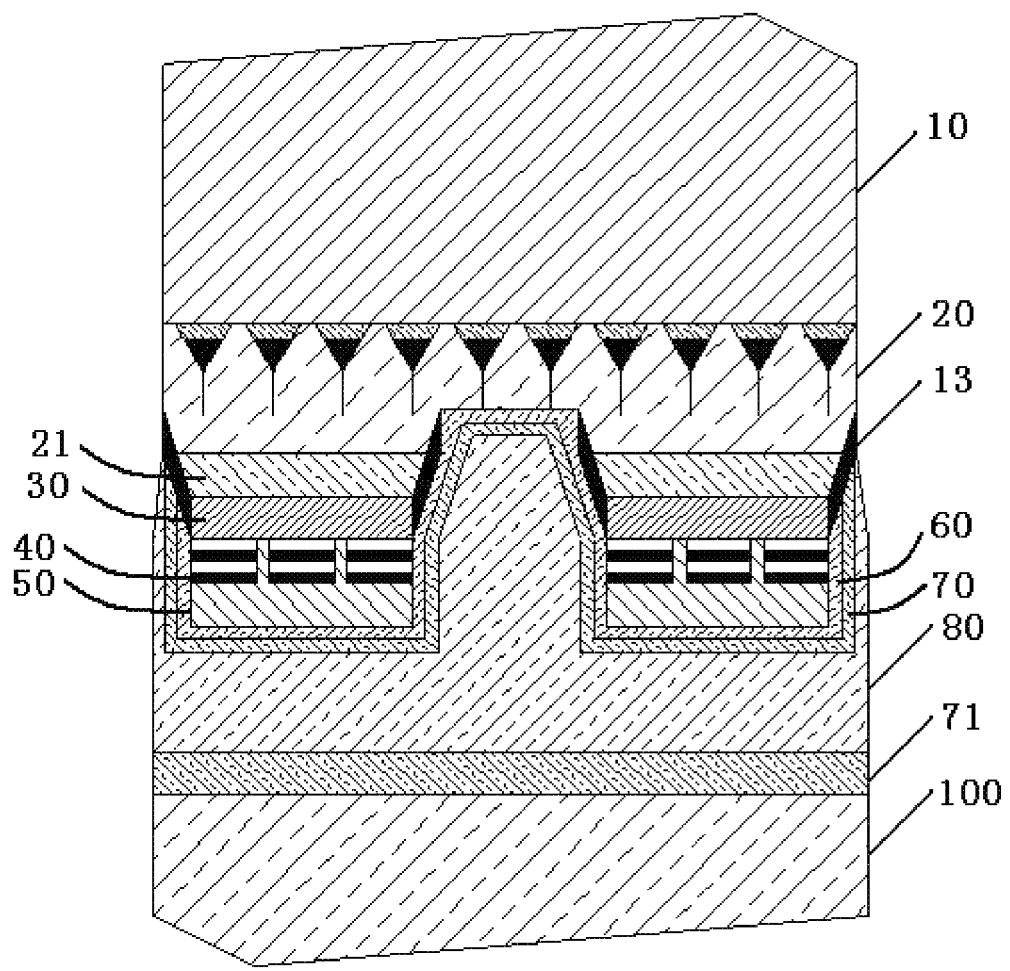

The GaN and the Si wafer are binded with each other by a binding machine to form a structure shown in FIG. 37.

Figure 38:
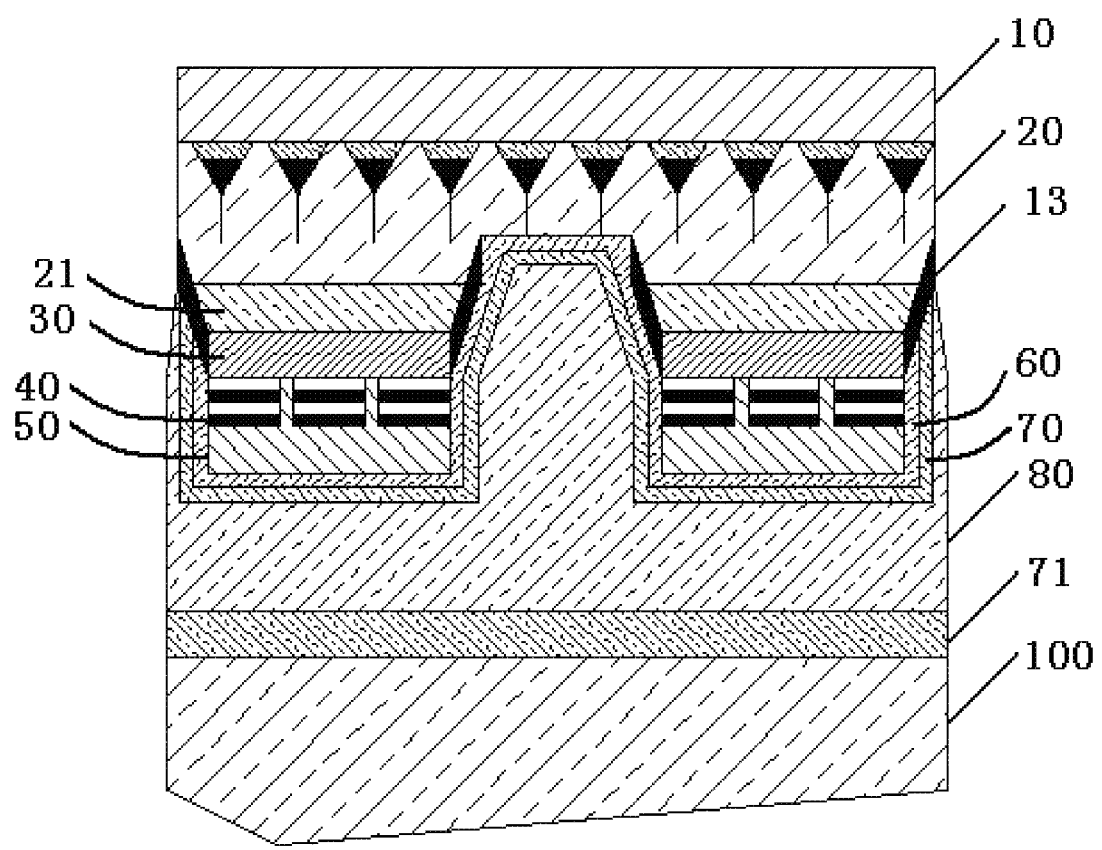

The sapphire substrate 10 is thinned and polished to 35 micron, as shown in FIG. 38.

The sapphire substrate is sliced along the scribing groove to the Si substrate by laser, as shown in FIG. 39.

Figure 40:
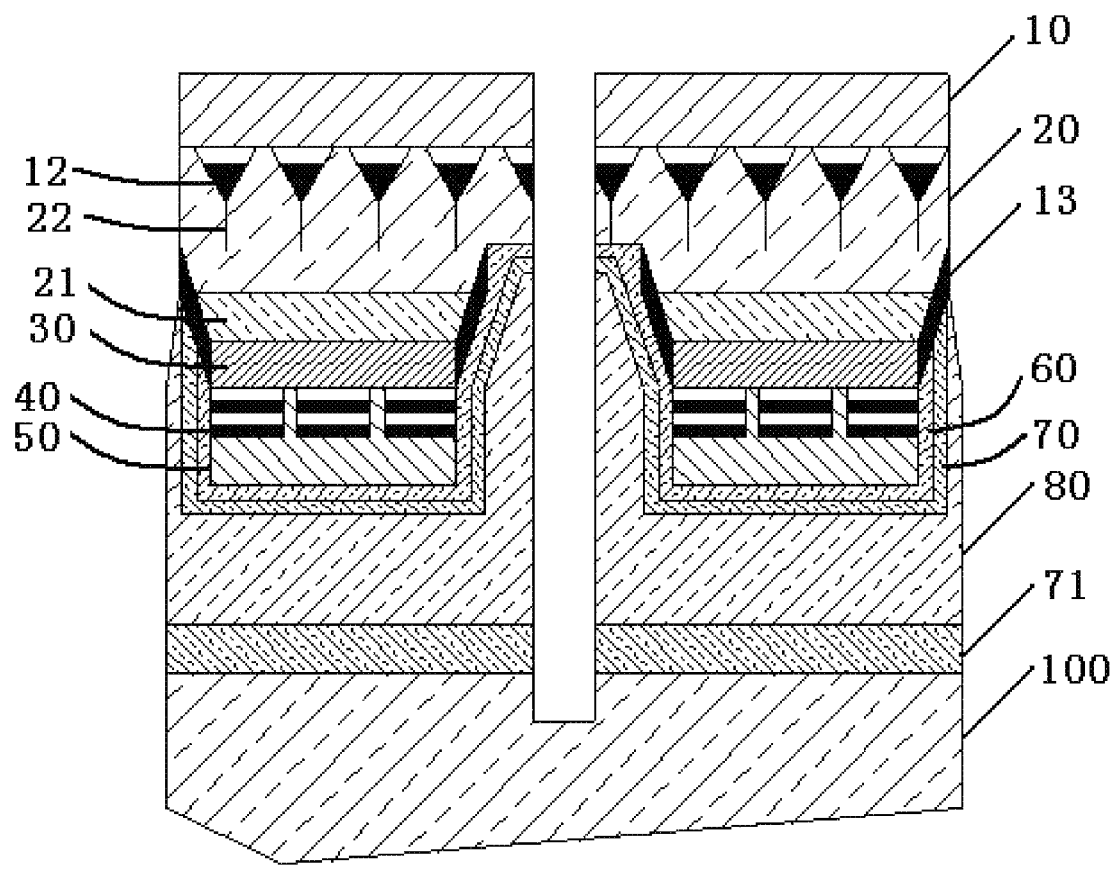

The sample is put into a buffer oxidation etching agent to remove the SiO2 film 11 under the epitaxial layer and keep the SiNx film 12 left by side etching, as shown in FIG. 40.

Figure 41:
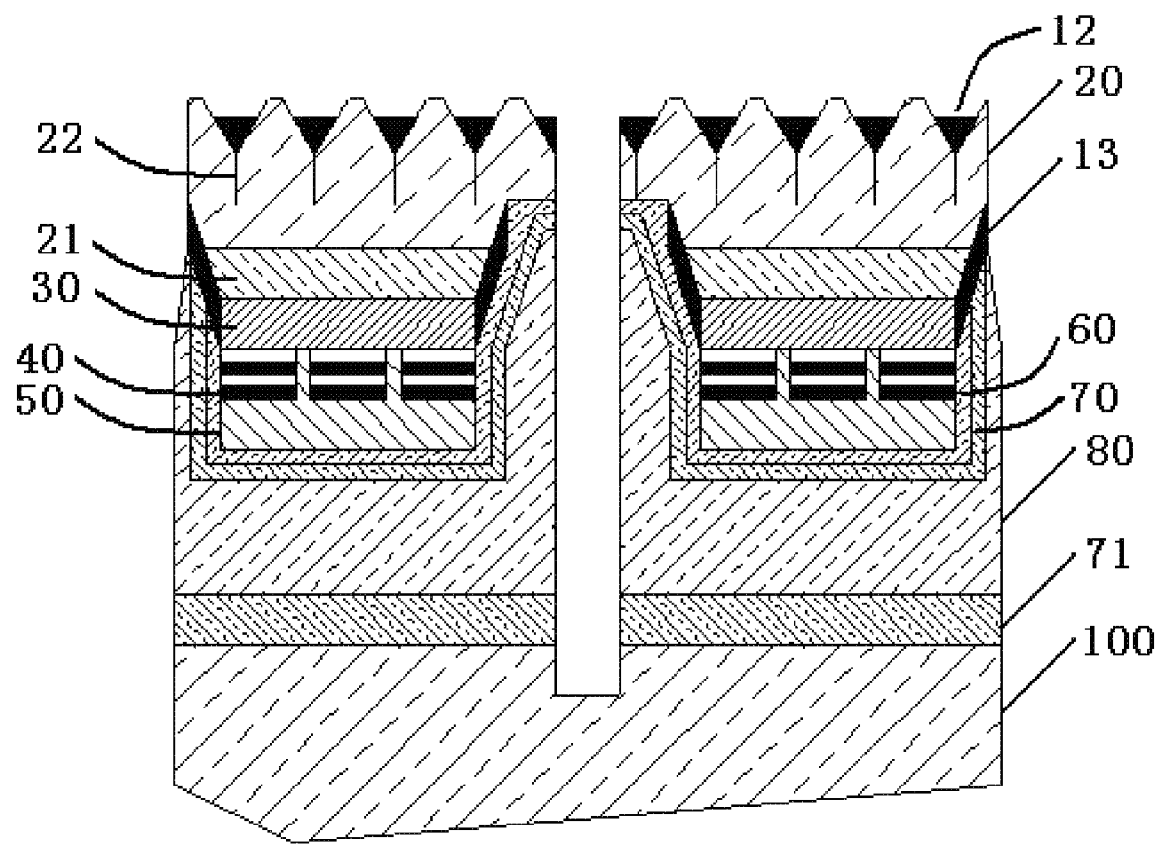

The sample is put into a potassium hydroxide solution. Because the SiO2 11 of the graphical substrate is removed and cavities are left, the potassium hydroxide solution can permeate into the cavities and side etch the GaN between the cavities, and thus stripping the GaN and the sapphire substrate. Although the GaN defections are located above the SiNx, the potassium hydroxide solution cannot corrode the GaN region 22 with a high defection density because of the protection of the SiNx, and therefore the entire GaN epitaxial layer is protected. A structure shown as in FIG. 41 is formed.

Figure 42:
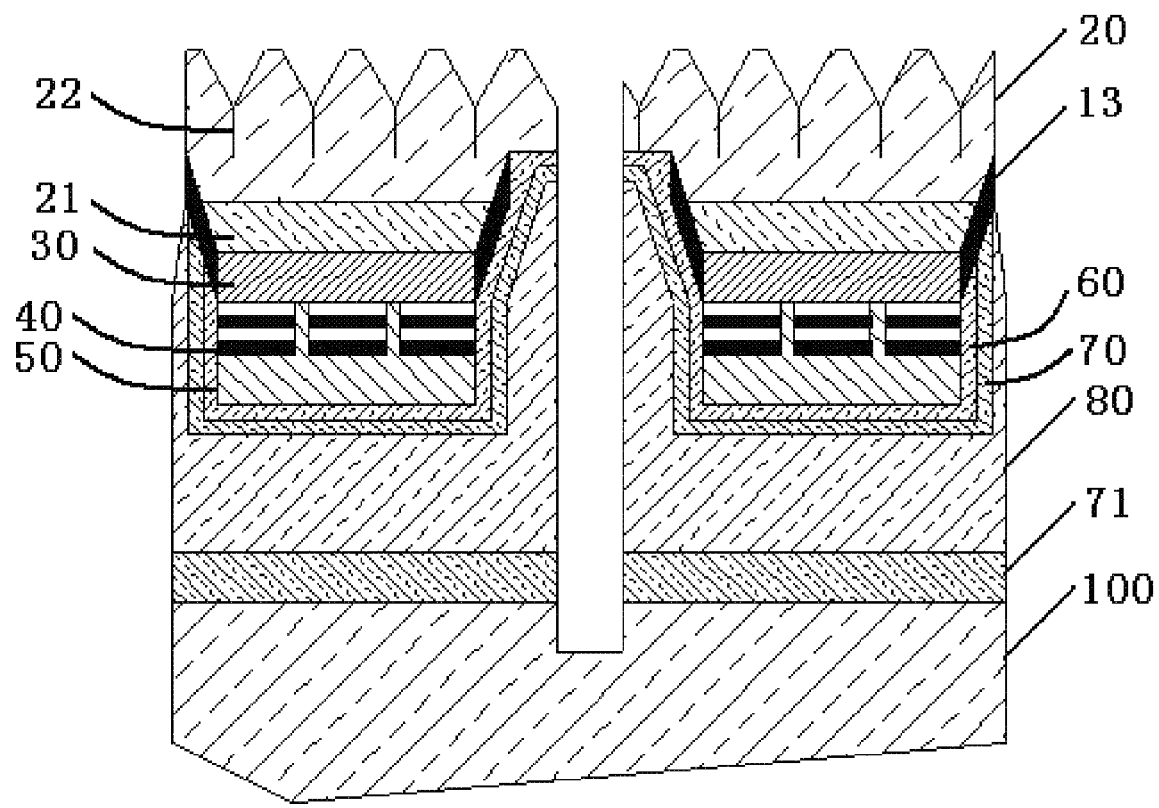

The SiNx film 12 is removed by dry etching, as shown in FIG. 42.

Figure 43:
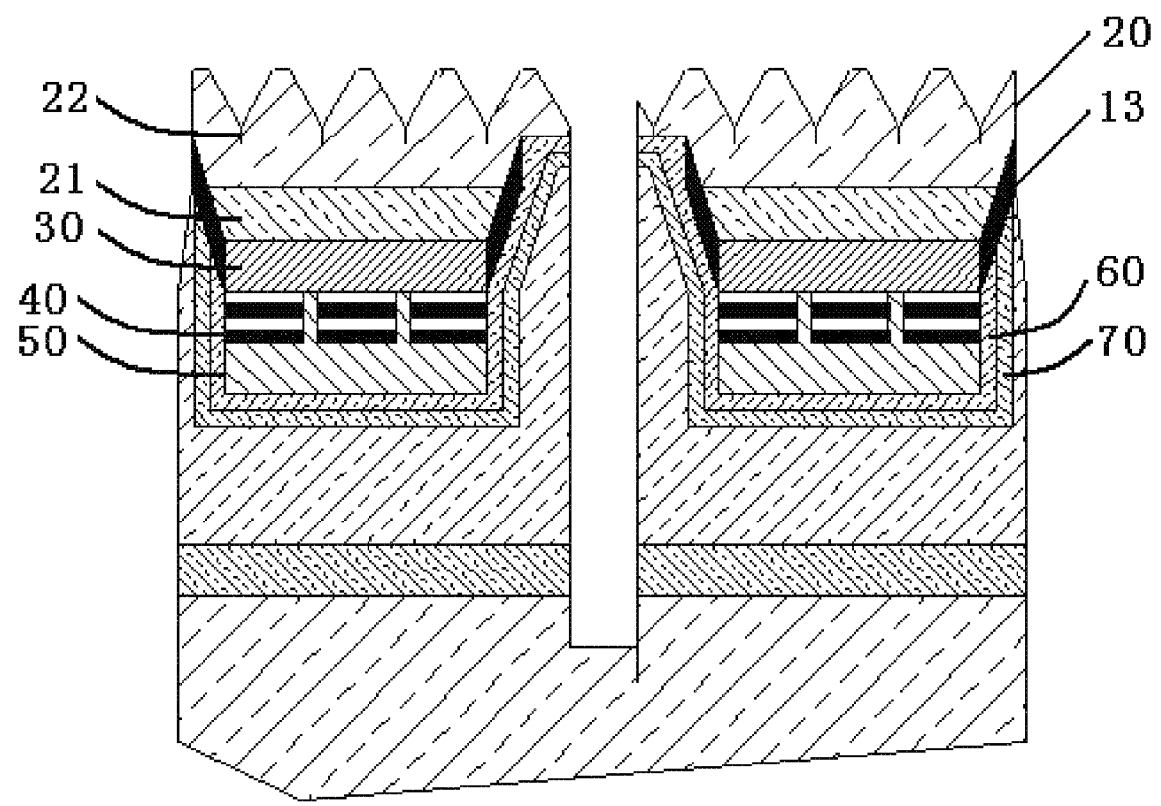

The N-type GaN layer 20 is etched until the thickness of the N-type GaN layer is 1.2 micron, as shown in FIG. 43.

Figure 44:
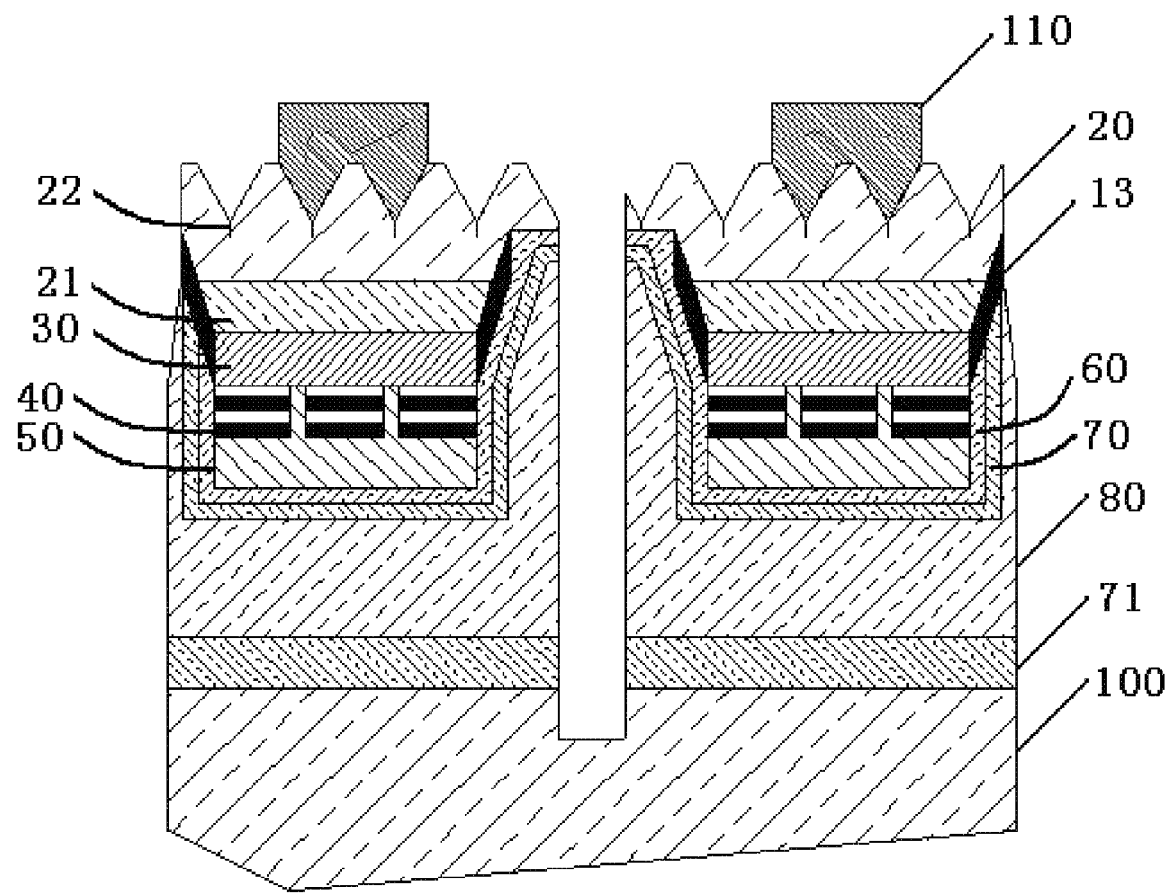

N electrodes 110 are prepared using Cr—Au material by lift-off technology to obtain the final device structure, as shown in FIG. 44.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for preparing a light-emitting diode having a vertical structure, the method comprising:
   a) preparing a graphical growth substrate, the growth substrate from bottom to top successively including a sapphire substrate, a second layer of a material with a high melting point, and a first layer of stable material with a high melting point, wherein the material in the second layer corrodes in an acidic solution or an alkaline solution, the melting points of the first layer and the second layer of material with a high melting point are greater than 900° C.;
   b) growing a GaN base light-emitting diode epitaxial layer on the graphical growth substrate, the GaN base light-emitting diode epitaxial layer from bottom to top successively including a N-type GaN layer and a P-type GaN layer;
   c) successively forming a transparent and electrically conductive film, an omni-directional reflection layer, an electrically conductive reflection layer and a passive metal protection layer from bottom to top on the GaN base light-emitting diode epitaxial layer, the electrically conductive reflection layer being connected with the transparent and electrically conductive film through holes in the omni-directional reflection layer, binding a support substrate having a high thermal conductivity to the passive metal protection layer by binding technology, removing the second layer of the material with a high melting point of the growth substrate and part of the GaN base epitaxial layer and stripping the sapphire substrate by a wet process; and d) removing the first layer of stable material with a high melting point of the growth substrate by dry etching, exposing the N-type GaN layer, and preparing an N electrode on the N-type GaN layer.

2. The method of claim 1, wherein a) comprises:
a1) successively forming two layers of high melting point material film on the sapphire substrate, the second layer of material adjacent to the sapphire substrate being material with a high melting point that corrodes in an acidic solution or an alkaline solution, and the first layer of material being stable material with a high melting point;
a2) preparing a mask on the high melting point material film using photoresist; and
a3) transferring a pattern of the photoresist to the high melting point material film, the pattern being mesh or stripe.

3. The method of claim 2, wherein in a3), the longitudinal section of the pattern is triangle, a bottom width of the section is 0.5-5 micron, particularly 1.5-4 micron, and more particularly 2.5 micron; a preferable height of the section being 0.5-5 micron, particularly 1.0-3 micron, and more particularly 1.5 micron, wherein the height of the second layer of high melting point material film is 0.7 micron, and the height of the first layer of high melting point material film is 0.8 micron; a preferable distance between the patterns is 0.5-5 micron, particularly 0.5-3micron, and more particularly 0.5 micron.

4. The method of claim 1, wherein the GaN base light-emitting diode epitaxial layer is grown on the graphical growth substrate through lateral growth.

5. The method of claim 1, wherein in b), the defects in the epitaxial layer are mainly located above the graphical substrate.

6. The method of claim 1, wherein c) comprises:
c1) etching through the epitaxial layer to expose the sapphire substrate; using an acid solution to remove the second layer of the material with a high melting point by side etching, the acid solution does not corrode or slowly corrodes the GaN base material and the first layer of stable material with a high melting point;
c2) etching the epitaxial layer to the N-type GaN layer;
c3) depositing a transparent and electrically conductive film on the P-type GaN layer to form an ohmic contact between the transparent and electrically conductive film and the P-type GaN layer;
c4) forming an omni-directional reflection layer on the transparent and electrically conductive film and forming holes in the omni-directional reflection layer;
c5) forming a passive film on the etching surface to protect the etching surface;
c6) forming a metal film on the omni-directional reflection layer as a conductive reflection layer which is connected with the transparent and electrically conductive film through the holes in the omni-directional reflection layer;
c7) filling the portion except the metal film as the conductive reflection layer with insulation material;
c8) forming a passive metal protection layer on the conductive reflection layer and the insulation material to protect the metal conductive reflection layer;
c9) forming a metal material layer for binding on the passive metal protection layer;
c10) forming a metal material layer for binding on a support substrate with a high thermal conductivity;
c11) binding the element portion having the GaN base epitaxial layer and the support substrate by binding the metal material layers for binding formed in c9) and c10);
c12) slicing the sapphire to the surface of the binding layer with laser along the position filled with the insulation material; and
c13) putting the sample into an acid or alkaline solution which can corrode the insulation material and the GaN material and cannot corrode the first layer of stable material with a high melting point.

7. The method of claim 6, wherein in c2), the etching surface is tilted.

8. The method of claim 1, wherein c) comprises:
c1) depositing a transparent and electrically conductive film on the P-type GaN layer to form an ohmic contact between the transparent and electrically conductive film and the P-type GaN layer;
c2) etching the transparent and electrically conductive film and the epitaxial layer to the N-type GaN layer;
c3) forming an omni-directional reflection layer on the transparent and electrically conductive film and forming holes in the omni-directional reflection layer;
c4) forming a passive film on the etching surface to protect the etching surface;
c5) forming a metal film on the omni-directional reflection layer as a conductive reflection layer which is connected with the transparent and electrically conductive film through the holes in the omni-directional reflection layer;
c6) forming a passive metal protection layer on the conductive reflection layer to protect the metal conductive reflection layer;
c7) forming a metal material layer for binding on the passive metal protection layer;
c8) forming a metal material layer for binding on a support substrate with a high thermal conductivity;
c9) binding the element portion having the GaN base epitaxial layer and the support substrate by binding the metal material layers for binding formed in c7) and c8);
c10) slicing the sapphire at least to the surface of the binding layer with laser along the etching position in c2);
c11) putting the sample into an acid or alkaline solution which can corrode the second layer of the material with a high melting point on the substrate and does not corrode or slowly corrodes the GaN base material and the first layer of stable material with a high melting point; and
c12) putting the sample into an acid or alkaline solution which can corrode the GaN material and cannot corrode the first layer of stable material with a high melting point.

9. The method of claim 8, wherein in c2), the etching surface is tilted.

10. The method of claim 8, wherein c10) comprises slicing the sapphire at least to the surface of the support substrate with laser along the etching position in c2).

11. The method of claim 1, wherein d) comprises:
d1) removing the first layer of stable material with a high melting point by dry etching;

d2) etching the GaN base material, preferably until the thickness of the N-type GaN layer is decreased to 1.5 micron;

d3) preparing an N electrode by lift-off technology to obtain a final device structure.

12. A method for preparing a light-emitting diode having a vertical structure, the method comprising:
a) preparing a graphical growth substrate, the growth substrate from bottom to top successively including a sapphire substrate, a second layer of a material with a high melting point, and a first layer of stable material with a high melting point, wherein the material in the second layer corrodes in an acidic solution or an alkaline solution, the melting points of the first layer and the second layer of material with a high melting point are greater than 900° C., a pattern formed in the second layer of the material with a high melting point and the first layer of stable material with a high melting point is mesh or stripe, and the longitudinal section of the pattern is decreased gradually from bottom to top;
b) growing a GaN base light-emitting diode epitaxial layer on the graphical growth substrate, the GaN base light-emitting diode epitaxial layer from bottom to top successively including a N-type GaN layer and a P-type GaN layer;
c) successively forming a transparent and electrically conductive film, an omni-directional reflection layer, an electrically conductive reflection layer and a passive metal protection layer from bottom to top on the GaN base light-emitting diode epitaxial layer, binding a support substrate having a high thermal conductivity to the passive metal protection layer by binding technology, removing the second layer of the material with a high melting point of the growth substrate and part of the GaN base epitaxial layer and stripping the sapphire substrate by a wet process; and
d) removing the first layer of stable material with a high melting point of the growth substrate by dry etching, exposing the N-type GaN layer, and preparing an N electrode on the N-type GaN layer.

13. The method of claim 12, wherein the longitudinal section of the pattern is triangle, a bottom width of the section is 0.5-5 micron, particularly 1.5-4 micron, and more particularly 2.5 micron; a preferable height of the section being 0.5-5 micron, particularly 1.0-3 micron, and more particularly 1.5 micron, wherein the height of the second layer of high melting point material film is 0.7 micron, and the height of the first layer of high melting point material film is 0.8 micron; a preferable distance between the patterns is 0.5-5 micron, particularly 0.5-3 micron, and more particularly 0.5 micron.

14. The method of claim 12, wherein in b), the GaN base light-emitting diode epitaxial layer is grown on the graphical growth substrate through lateral growth.

15. The method of claim 12, wherein c) comprises:
c1) etching through the epitaxial layer to expose the sapphire substrate; using an acid solution to remove the second layer of the material with a high melting point by side etching, the acid solution does not corrode or slowly corrodes the GaN base material and the first layer of stable material with a high melting point;
c2) etching the epitaxial layer to the N-type GaN layer;
c3) depositing a transparent and electrically conductive film on the P-type GaN layer to form an ohmic contact between the transparent and electrically conductive film and the P-type GaN layer;
c4) forming an reflection layer on the transparent and electrically conductive film;
c5) forming a passive film on the etching surface to protect the etching surface;
c6) filling the portion except the reflection layer with insulation material;
c7) forming a passive metal protection layer on the reflection layer and the insulation material to protect the reflection layer;
c8) forming a metal material layer for binding on the passive metal protection layer;
c9) forming a metal material layer for binding on a support substrate with a high thermal conductivity;
c10) binding the element portion having the GaN base epitaxial layer and the support substrate by binding the metal material layers for binding formed in c8) and c9);
c11) slicing the sapphire to the surface of the binding layer with laser along the position filled with the insulation material; and
c12) putting the sample into an acid or alkaline solution which can corrode the insulation material and the GaN material and cannot corrode the first layer of stable material with a high melting point.

16. The method of claim 12, wherein c) comprises:
c1) depositing a transparent and electrically conductive film on the P-type GaN layer to form an ohmic contact between the transparent and electrically conductive film and the P-type GaN layer;
c2) etching the transparent and electrically conductive film and the epitaxial layer to the N-type GaN layer;
c3) forming an reflection layer on the transparent and electrically conductive film;
c4) forming a passive film on the etching surface to protect the etching surface;
c5) forming a passive metal protection layer on the reflection layer to protect the reflection layer;
c6) forming a metal material layer for binding on the passive metal protection layer;
c7) forming a metal material layer for binding on a support substrate with a high thermal conductivity;
c8) binding the element portion having the GaN base epitaxial layer and the support substrate by binding the metal material layers for binding formed in c6) and c7);
c9) slicing the sapphire along the etching position in c2) with laser until the second layer of the material is exposed;
c10) putting the sample into an acid or alkaline solution which can corrode the second layer of the material with a high melting point in the substrate and does not corrode or slowly corrodes the GaN base material and the first layer of stable material with a high melting point; and
c11) putting the sample into an acid or alkaline solution which can corrode the GaN material and cannot corrode the first layer of stable material with a high melting point.

17. A light-emitting diode having a vertical structure formed by the method of claim 1, the light-emitting diode having a vertical structure successively comprising: a support substrate (100) with a high thermal conductivity, a binding layer, a passive metal protection layer (60), a conductive reflection layer (59), an omni-directional reflection layer (40), a transparent and electrically conductive film (30), a GaN base epitaxial layer and an N electrode (110); wherein the conductive reflection layer (59) is connected with the transparent and electrically conductive film (30) through holes in the omni-directional reflection layer (40), the GaN base epitaxial layer successively includes a P-type GaN layer (21) and a N-type GaN layer (20).

18. The light-emitting diode of claim 17, wherein a high-density defect region (22) is formed in the N-type GaN layer.

19. The light-emitting diode of claim 17, wherein a tilt etching surface is formed on the side portion of the transparent and electrically conductive film (30) and the GaN base epitaxial layer, and a passive film (13) is formed on the etching surface.

20. The light-emitting diode of claim 19, wherein the support substrate (100) is made of Si or ceramic material.

* * * * *